(12) United States Patent
Kim et al.

(10) Patent No.: US 10,103,214 B2
(45) Date of Patent: Oct. 16, 2018

(54) DISPLAY DEVICE

(71) Applicant: Samsung Display Co., Ltd., Yongin-si, Gyeonggi-do (KR)

(72) Inventors: Iljoo Kim, Yongin-si (KR); Mukyung Jeon, Yongin-si (KR); Heerim Song, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 15/354,923

(22) Filed: Nov. 17, 2016

(65) Prior Publication Data
US 2017/0141177 A1    May 18, 2017

(30) Foreign Application Priority Data
Nov. 18, 2015 (KR) .......................... 10-2015-0161727

(51) Int. Cl.
*G09G 3/32* (2016.01)
*H01L 27/32* (2006.01)
(Continued)

(52) U.S. Cl.
CPC ....... *H01L 27/3276* (2013.01); *G09G 3/3233* (2013.01); *G09G 3/3258* (2013.01); *G09G 3/3266* (2013.01); *G09G 3/3275* (2013.01); *H01L 27/3216* (2013.01); *H01L 27/3262* (2013.01); *H01L 27/3265* (2013.01); *H01L 29/78696* (2013.01); *G09G 2300/0426* (2013.01); *G09G 2300/0452* (2013.01);
(Continued)

(58) Field of Classification Search
CPC . H01L 27/1214; H01L 27/32–27/3297; G09G 3/2085; G09G 3/3233; G09G 3/3258–3/3275; G09G 2300/0426; G09G 2310/0227; G09G 2310/0297; G09G 2310/08; G09G 2320/0209
See application file for complete search history.

(56) References Cited

U.S. PATENT DOCUMENTS 8,355,090 B2 * 1/2013 Kwon ............... G02F 1/136286
349/141
8,482,709 B2 * 7/2013 Shin .................. G02F 1/133753
349/129
(Continued)

FOREIGN PATENT DOCUMENTS

| JP | 2010-60648 A | 3/2010 |
| KR | 10-2015-0006729 A | 1/2015 |
| KR | 10-2015-0025537 A | 3/2015 |

*Primary Examiner* — Maliheh Malek

(57) ABSTRACT

A display device is disclosed. In one aspect, the device includes a plurality of pixels arranged in rows and columns, each pixel including a transistor that includes first and second electrodes in a column direction, and a channel curved between the first and second electrodes, and a capacitor overlapping the transistor. The device also includes a first data line connected to at least one first pixel in an odd row of the pixels arranged in the columns, and overlapping a first electrode of a transistor of the first pixel and a second data line connected to at least one second pixel in an even row of the pixels arranged in the columns, and overlapping a first electrode of a transistor of the second pixel. The first and second data lines are arranged in the columns and are parallel to one another.

20 Claims, 14 Drawing Sheets

(51) Int. Cl.
  *G09G 3/3233* (2016.01)
  *G09G 3/3258* (2016.01)
  *G09G 3/3266* (2016.01)
  *G09G 3/3275* (2016.01)
  *H01L 29/786* (2006.01)
  *H01L 29/78* (2006.01)
  *H01L 27/12* (2006.01)

(52) U.S. Cl.
  CPC ............ *G09G 2310/0227* (2013.01); *G09G 2310/0297* (2013.01); *G09G 2310/08* (2013.01); *G09G 2320/0209* (2013.01); *H01L 27/1214* (2013.01)

(56) References Cited

U.S. PATENT DOCUMENTS

| | | | | |
|---|---|---|---|---|
| 8,792,074 | B2* | 7/2014 | Cho | G09G 3/36 |
| | | | | 349/141 |
| 9,064,472 | B2* | 6/2015 | Kim | G09G 3/3659 |
| 9,158,168 | B2* | 10/2015 | Lee | G02F 1/13624 |
| 9,448,656 | B2* | 9/2016 | Xu | G06F 3/0412 |
| 9,552,771 | B2* | 1/2017 | Jeon | G09G 3/3225 |
| 9,711,585 | B2* | 7/2017 | Kim | H01L 51/5209 |
| 9,847,055 | B2* | 12/2017 | Kim | G09G 3/3225 |
| 2006/0097628 | A1* | 5/2006 | Suh | H01L 27/3211 |
| | | | | 313/504 |
| 2009/0109364 | A1* | 4/2009 | Yang | G03F 7/0005 |
| | | | | 349/46 |
| 2009/0242884 | A1* | 10/2009 | Sagawa | H01L 27/1285 |
| | | | | 257/59 |
| 2009/0315031 | A1* | 12/2009 | Kim | H01L 27/1214 |
| | | | | 257/59 |
| 2010/0053042 | A1 | 3/2010 | Kajiyama et al. | |
| 2010/0097359 | A1* | 4/2010 | Yamada | G02F 1/133707 |
| | | | | 345/205 |
| 2011/0012816 | A1* | 1/2011 | Kang | H01L 27/326 |
| | | | | 345/76 |
| 2011/0115691 | A1* | 5/2011 | Liu | G02F 1/136286 |
| | | | | 345/55 |
| 2011/0221733 | A1 | 9/2011 | Sato | |
| 2011/0267571 | A1* | 11/2011 | Lee | G02F 1/134363 |
| | | | | 349/141 |
| 2012/0313904 | A1* | 12/2012 | Wang | G09G 3/20 |
| | | | | 345/204 |
| 2013/0135572 | A1* | 5/2013 | Park | G02F 1/134336 |
| | | | | 349/143 |
| 2013/0256669 | A1* | 10/2013 | Jang | G02F 1/136286 |
| | | | | 257/59 |
| 2013/0257839 | A1* | 10/2013 | Hyeon | G06F 3/038 |
| | | | | 345/212 |
| 2014/0034923 | A1* | 2/2014 | Kim | H01L 27/3297 |
| | | | | 257/40 |
| 2014/0118319 | A1* | 5/2014 | Jeon | G06F 1/00 |
| | | | | 345/207 |
| 2014/0124754 | A1* | 5/2014 | Park | G09G 3/32 |
| | | | | 257/40 |
| 2014/0292622 | A1* | 10/2014 | Lee | G09G 3/3233 |
| | | | | 345/80 |
| 2014/0332764 | A1* | 11/2014 | Bang | H01L 27/3262 |
| | | | | 257/40 |
| 2015/0009108 | A1* | 1/2015 | Song | G09G 3/3225 |
| | | | | 345/80 |
| 2015/0015468 | A1 | 1/2015 | Ko et al. | |
| 2015/0061983 | A1 | 3/2015 | Kim | |
| 2015/0061986 | A1* | 3/2015 | Song | G02F 1/134363 |
| | | | | 345/90 |
| 2015/0138171 | A1* | 5/2015 | Kim | H01L 27/3223 |
| | | | | 345/205 |
| 2015/0255523 | A1* | 9/2015 | Her | H01L 27/3262 |
| | | | | 345/76 |
| 2015/0262526 | A1* | 9/2015 | Park | G09G 3/3233 |
| | | | | 345/76 |
| 2015/0279271 | A1* | 10/2015 | Xi | G09G 3/3233 |
| | | | | 345/211 |
| 2015/0294618 | A1* | 10/2015 | Park | G09G 3/3233 |
| | | | | 345/214 |
| 2016/0035294 | A1* | 2/2016 | Kim | H01L 27/124 |
| | | | | 345/96 |
| 2016/0035805 | A1* | 2/2016 | Kim | H01L 27/3262 |
| | | | | 345/76 |
| 2016/0055807 | A1* | 2/2016 | Lee | G02F 1/134336 |
| | | | | 345/205 |
| 2016/0104442 | A1* | 4/2016 | Jin | G09G 3/3648 |
| | | | | 345/92 |
| 2016/0111484 | A1* | 4/2016 | An | H01L 27/3276 |
| | | | | 257/72 |
| 2016/0149156 | A1* | 5/2016 | Kim | H01L 51/5228 |
| | | | | 257/40 |
| 2016/0155393 | A1* | 6/2016 | Jung | G09G 3/3607 |
| | | | | 345/89 |
| 2016/0299388 | A1* | 10/2016 | Lee | G02F 1/134309 |
| 2016/0321994 | A1* | 11/2016 | Lee | G09G 3/3258 |
| 2016/0322449 | A1* | 11/2016 | Pyon | H01L 27/3276 |
| 2016/0322450 | A1* | 11/2016 | Lee | H01L 27/3276 |
| 2016/0349548 | A1* | 12/2016 | Xu | H01L 27/124 |
| 2016/0370669 | A1* | 12/2016 | Mok | G09G 3/3614 |
| 2017/0125506 | A1* | 5/2017 | Kim | H01L 51/5212 |
| 2017/0140706 | A1* | 5/2017 | Song | G09G 3/3233 |
| 2017/0219877 | A1* | 8/2017 | Hwang | G02F 1/133514 |
| 2017/0221979 | A1* | 8/2017 | Chae | H01L 27/3262 |
| 2017/0278906 | A1* | 9/2017 | Song | H01L 27/3218 |
| 2017/0337865 | A1* | 11/2017 | Kim | G09G 3/2092 |
| 2017/0373094 | A1* | 12/2017 | Park | H01L 27/1222 |
| 2018/0130440 | A1* | 5/2018 | Kim | G02F 1/136286 |

\* cited by examiner

DISPLAY DEVICE

CROSS-REFERENCE TO RELATED APPLICATION

This application claims the benefit of Korean Patent Application No. 10-2015-0161727, filed on Nov. 18, 2015, in the Korean Intellectual Property Office, the disclosure of which is incorporated herein in its entirety by reference.

BACKGROUND

Field

The described technology generally relates to a display device.

Description of the Related Technology

Display devices display images, and recently, organic light-emitting diode (OLED) displays are receiving spotlight.

Since an OLED display is self-emissive, it does not require a separate light source unlike a liquid crystal display (LCD). Thus, OLED technology has desirable features such as low power consumption, high luminance, lightweight, thin profile, and fast response speeds.

As the resolution of a display device increases, the line time for driving a single row may decrease and the time for compensating a threshold voltage of a driving transistor may become insufficient. Therefore, data demultiplexing may be used to obtain compensation time.

SUMMARY OF CERTAIN INVENTIVE ASPECTS

One inventive aspect relates to a pixel structure that can reduce crosstalk between data lines without changing a pixel size, while securing capacitance.

Another aspect is a display device that includes a plurality of pixels arranged in rows and columns on a substrate, each of the plurality of pixels comprising a transistor that comprises a first electrode and a second electrode in a column direction, and a channel that is curved between the first and second electrodes, and a capacitor overlapping the transistor; a first data line connected to pixels in an odd row from among the pixels arranged in the columns, and overlapping a first electrode of a transistor of each of the connected pixels; and a second data line connected to pixels in an even row from among the pixels arranged in the columns, and overlapping a first electrode of a transistor of each of the connected pixels. The first and second data lines are arranged in the columns and are parallel to one another.

According to the present embodiment, respective locations of a first electrode and a second electrode of the transistor of the pixel in the odd row are opposite to respective locations of a first electrode and a second electrode of the transistor of the pixel in the even row.

According to the present embodiment, the capacitor is between the first data line and the second data line.

According to the present embodiment, the capacitor overlaps the channel of the transistor, and a lower electrode of the capacitor is a gate electrode of the transistor, and an upper electrode of the capacitor covers the lower electrode.

According to the present embodiment, the first data line does not overlap the second electrode of the transistor of the pixel in the even row, and the second data line does not overlap the second electrode of the transistor of the pixel in the odd row.

According to the present embodiment, the first and second data lines in the odd row and the first and second data lines in the even row are shifted by a certain distance and arranged in zigzags in the column direction.

According to the present embodiment, the first and second data lines extend in a straight line, and the pixel in the odd row and the pixel in the even row may be shifted by a certain distance and arranged in zigzags in the column direction.

According to the present embodiment, the first electrode of the transistor is a source electrode or a drain electrode.

According to the present embodiment, light emitted by a pixel connected to the first data line and light emitted by a pixel connected to the second data line have different colors.

According to the present embodiment, a pixel connected to the first data line has a different size from a pixel connected to the second data line.

According to the present embodiment, the first data line and the second data line are alternately arranged in a row direction.

Another aspect is a display device that includes a plurality of pixels arranged in rows and columns on a substrate, each of the plurality of pixels comprising a transistor that comprises a first electrode and a second electrode in a column direction, and a channel that is curved between the first and second electrodes, and a capacitor overlapping the transistor; a first data line connected to a pixel in an odd row or a pixel in an even row; and a second data line connected to a pixel that is not connected to the first data line from among the pixel in the odd row and the pixel in the even row. The first and second data lines are arranged in each of the columns and are parallel to one another.

According to the present embodiment, each of the first data line and the second data line overlaps a first electrode of the transistor of the connected pixel, and respective locations of a first electrode and a second electrode of the transistor of the pixel in the odd row are opposite to respective locations of a first electrode and a second electrode of the transistor of the pixel in the even row.

According to the present embodiment, the capacitor is between the first data line and the second data line.

According to the present embodiment, the capacitor overlaps the channel of the transistor, and a lower electrode of the capacitor is a gate electrode of the transistor, and an upper electrode of the capacitor covers the lower electrode.

According to the present embodiment, the second data line is between the capacitor, and the second electrode of the transistor of the pixel connected to the first data line, and the first data line is between the capacitor, and the second electrode of the transistor of the pixel connected to the second data line.

According to the present embodiment, the first and second data lines in the odd row and the first and second data lines in the even row are shifted by a certain distance and arranged in zigzags in the column direction.

According to the present embodiment, the first and second data lines extend in a straight line, and the pixel in the odd row and the pixel in the even row are shifted by a certain distance and arranged in zigzags in the column direction.

According to the present embodiment, the first electrode of the transistor is a source electrode or a drain electrode.

According to the present embodiment, light emitted by a pixel connected to the first data line and light emitted by a pixel connected to the second data line have different colors.

According to the present embodiment, a pixel connected to the first data line has a different size from a pixel connected to the second data line.

According to the present embodiment, the first data line and the second data line are alternately arranged in a row direction.

Another aspect is a display device comprising: a plurality of pixels arranged in rows and columns over a substrate, each of the pixels comprising a transistor that comprises a first electrode and a second electrode in a column direction, and a channel that is curved between the first and second electrodes, and a capacitor overlapping the transistor; a first data line connected to at least one first pixel in an odd row of the pixels arranged in the columns, and overlapping a first electrode of a transistor of the first pixel; and a second data line connected to at least one second pixel in an even row of the pixels arranged in the columns, and overlapping a first electrode of a transistor of the second pixel, wherein the first and second data lines are arranged in the columns and are parallel to one another, and wherein respective locations of the first electrode and a second electrode of the transistor of the first pixel in the odd row are opposite to respective locations of the first electrode and a second electrode of the transistor of the second pixel in the even row.

In the above display device, each of the capacitors is between the first and second data lines. In the above display device, each of the capacitors overlaps the channel of the corresponding transistor, wherein a lower electrode of the capacitor is a gate electrode of the transistor, and wherein an upper electrode of the capacitor covers the lower electrode. In the above display device, the first data line does not overlap the second electrode of the transistor of the second pixel in the even row, and wherein the second data line does not overlap the second electrode of the transistor of the first pixel in the odd row. In the above display device, the first and second data lines in the odd row and the first and second data lines in the even row are arranged in zigzags in the column direction. In the above display device, the first and second data lines extend in a straight line, and wherein the first pixel in the odd row and the second pixel in the even row are arranged in zigzags in the column direction.

In the above display device, the first electrode of each of the transistors is a source electrode or a drain electrode. In the above display device, light emitted by a pixel connected to the first data line and light emitted by a pixel connected to the second data line have different colors. In the above display device, a pixel connected to the first data line has a different size from a pixel connected to the second data line. In the above display device, the first and second data lines are alternately arranged in a row direction.

Another aspect is a display device comprising: a plurality of pixels arranged in rows and columns over a substrate, each of the pixels comprising a transistor that comprises a first electrode and a second electrode in a column direction, and a channel that is curved between the first and second electrodes, and a capacitor overlapping the transistor; a first data line connected to a selected one of a first pixel in an odd row and a second pixel in an even row; and a second data line connected to the other one of the first and second pixels that is not connected to the first data line, wherein the first and second data lines are arranged in each of the columns and are parallel to one another, wherein the first and second data lines respectively overlap a first electrode of a transistor of the first and second pixels, and wherein respective locations of a first electrode and a second electrode of the transistor of the first pixel in the odd row are opposite to respective locations of a first electrode and a second electrode of the transistor of the second pixel in the even row.

In the above display device, each of the capacitors is between the first and second data lines. In the above display device, each of the capacitors overlaps the channel of the corresponding transistor, and wherein a lower electrode of the capacitor is a gate electrode of the transistor, and wherein an upper electrode of the capacitor covers the lower electrode.

In the above display device, the second data line is between the capacitor, and the second electrode of the transistor of the selected pixel connected to the first data line, and wherein the first data line is between the capacitor, and the second electrode of the transistor of the other pixel connected to the second data line. In the above display device, the first and second data lines in the odd row and the first and second data lines in the even row are arranged in zigzags in the column direction. In the above display device, the first and second data lines extend in a straight line, and wherein the first pixel in the odd row and the second pixel in the even row are arranged in zigzags in the column direction.

In the above display device, the first electrode of each of the transistors is a source electrode or a drain electrode. In the above display device, light emitted by a pixel connected to the first data line and light emitted by a pixel connected to the second data line have different colors. In the above display device, a pixel connected to the first data line has a different size from a pixel connected to the second data line. In the above display device, the first and second data lines are alternately arranged in a row direction.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

Figure 1:
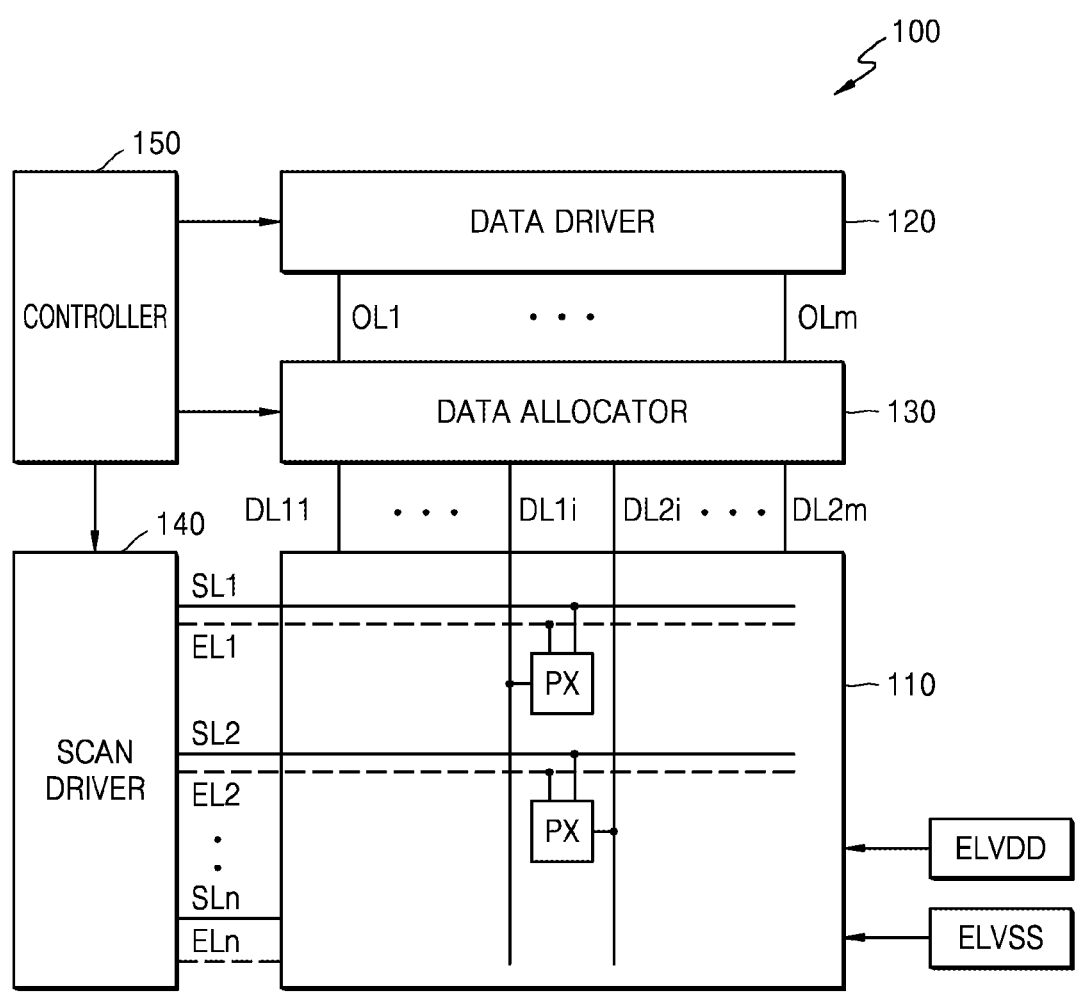
FIG. 1 is a schematic diagram of a display device according to an embodiment.

When the number of data lines in a pixel is increased to utilize data demultiplexing, crosstalk between data lines may increase and capacitance of the pixel may decrease.

As the inventive concept allows for various changes and numerous embodiments, particular embodiments will be illustrated in the drawings and described in the written description. The effect and features of the inventive concept and the method of realizing the effect and the features will be clear with reference to the embodiments described below with reference to the drawings. However, the inventive concept may be embodied in various forms and should not be construed as being limited to the embodiments. Expressions such as "at least one of" when preceding a list of elements, modify the entire list of elements and do not modify the individual elements of the list.

Hereinafter, the embodiments will be described with reference to the drawings. In order to clearly describe the present inventive concept, elements and features that are irrelevant to the present inventive concept are omitted. Like reference numerals refer to like elements in the drawings, and thus, descriptions of similar or identical elements will not be repeated.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Sizes of elements in the drawings may be exaggerated for convenience of explanation. In other words, since sizes and thicknesses of components in the drawings are arbitrarily illustrated for convenience of explanation, the following embodiments are not limited thereto.

In the present disclosure, the terms "corresponding" or "correspondingly" may indicate that components are arranged or connected at an identical column or a row in context. For example, when a first component is connected to a "corresponding" second component from among a plurality of second components, this indicates that the first component is connected to the second component that is provided at the same column or the same row as the first component.

FIG. 1 is a schematic diagram of a display device 100 according to an embodiment.

Referring to FIG. 1, the display device 100 includes a pixel unit 110, a data driver 120, a data allocator 130, a scan driver 140, and a controller 150. The display device 100 may be an organic light-emitting display device.

The pixel unit 110 may include a plurality of scan lines SL1 to SLn, a plurality of data lines DL11 to DL2$m$, a plurality of emission control lines EL1 to ELn, and a plurality of pixels PX. The scan lines SL1 to SLn are arranged in rows and transmitting scan signals. Scan lines connected to each of pixels may include a first scan line GILn applying a first scan signal GIn, a second scan line GWLn applying a second scan signal GWn, and a third scan line GBLn applying a third scan signal GBn (refer to FIG. 2). The data lines DL11 to DL2$m$ are arranged in columns and transmitting data signals. Two data lines are arranged for each column, and each of the two data lines per column includes a first data line DL1 connected to a pixel PX in an odd row and a second data line DL2 connected to a pixel PX in an even row. The first and second data lines DL1 and DL2 are adjacent to each other and alternately connected to the pixels PX located at an identical column. The first and second data lines DL1 and DL2 may be alternately arranged in a row. The scan lines SL1 to SLn and the data lines DL11 to DL2$m$ may be arranged as a matrix, and the pixels PX may be provided at intersections. The emission control lines EL1 to ELn transmit emission control signals. A first power voltage ELVDD and a second power voltage ELVSS are applied to each of the pixels PX of the pixel unit 110. The second power voltage ELVSS may be a lower voltage than the first power voltage ELVDD.

The data driver 120 may be connected to a plurality of output lines OL1 to OLm, and the output lines OL1 to OLm may be connected to the data lines DL11 to DL2$m$ via the data allocator 130. The data driver 120 may respond to control signals from the controller 150 and transform image signals into data signals in the form of a voltage or current. The data driver 120 may apply the data signals to the output lines OL1 to OLm.

Each of the data lines DL11 to DL2$m$ may include a data capacitor. The data capacitor may temporarily store the data signals that are applied to the data lines DL11 to DL2$m$, and apply the stored data signals to the pixels PX. A parasitic capacitor, which is equivalently formed on the data lines DL11 to DL2$m$, may be used as the data capacitor. Alternatively, capacitors may be additionally formed for each data line and be used as data capacitors.

The data allocator 130 may be connected to the output lines OL1 to OLm and the data lines DL11 to DL2$m$. The data allocator 130 may be provided as m demultiplexers that include a plurality of switches. The number of demultiplexers included in the data allocator 130 may be the same as the number of output lines. An end of each of the demultiplexers may be connected to any one of the output lines OL1 to OLm. Also, another end of each of the demultiplexers may be connected to the first and second data lines DL1 and DL2. The demultiplexers apply data signals from one output line to two data lines. By including the demultiplexers, the number of output lines connected to the data driver 120 does not have to be equal to the number of data lines, and thus, manufacturing cost may be reduced by connecting less output lines to the data driver 120 and including less integrated circuits in the data driver 120.

The demultiplexer may apply data signals to some data lines that are connected to that demultiplexer during a first horizontal period, and apply data signals to data lines other than the aforementioned data lines during a second horizontal period. In this case, data lines that receive data signals during an identical horizontal period may be connected to pixels PX located at an identical row. In response to a control signal from the controller 150, during a certain horizontal period, the demultiplexer may sequentially apply data signals to the first data lines DL1 connected to pixels in odd rows, and then, during a following horizontal period, sequentially apply data signals to the second data lines DL2 connected to pixels in even rows. For example, in response to a control signal from the controller 150, the demultiplexer applies, while the second scan signal GWn is being applied to the pixels in the odd rows, data signals to the second data lines DL2 connected to the pixels in the even rows connected to that demultiplexer. Furthermore, the demultiplexer may apply, while the second scan signal GWn is being applied to the pixels in the even rows, data signals to the first data lines DL1 connected to the pixels in the odd rows connected to that demultiplexer. While the second scan signal GWn is applied to a j-th scan line, data signals corresponding to a (j+1)-th row are applied.

The scan driver 140 is connected to the scan lines SL1 to SLn, generates scan signals in response to a control signal from the controller 150, and applies the scan signals to the scan lines SL1 to SLn. Also, the scan driver 140 is connected to the emission control lines EL1 to ELn, generates emission control signals in response to a control signal from the controller 150, and applies the emission control signals to the emission control lines EL1 to ELn. According to the embodiment of FIG. 1, the scan driver 140 generates and applies the emission control signals to the pixel unit 110. Alternatively, an additional emission controller may generate and apply the emission control signals to the pixel unit 110.

The controller 150 may generate control signals in response to synchronization signals applied from an external source. The controller 150 may output a control signal for controlling the data driver 120 to the data driver 120, and output a control signal for controlling the scan driver 140 to the scan driver 140. The controller 150 may apply the control signals to each of the demultiplexers. In this case, the controller 150 may control application of the control signals such that the data signals may be applied in row units.

Figure 2:
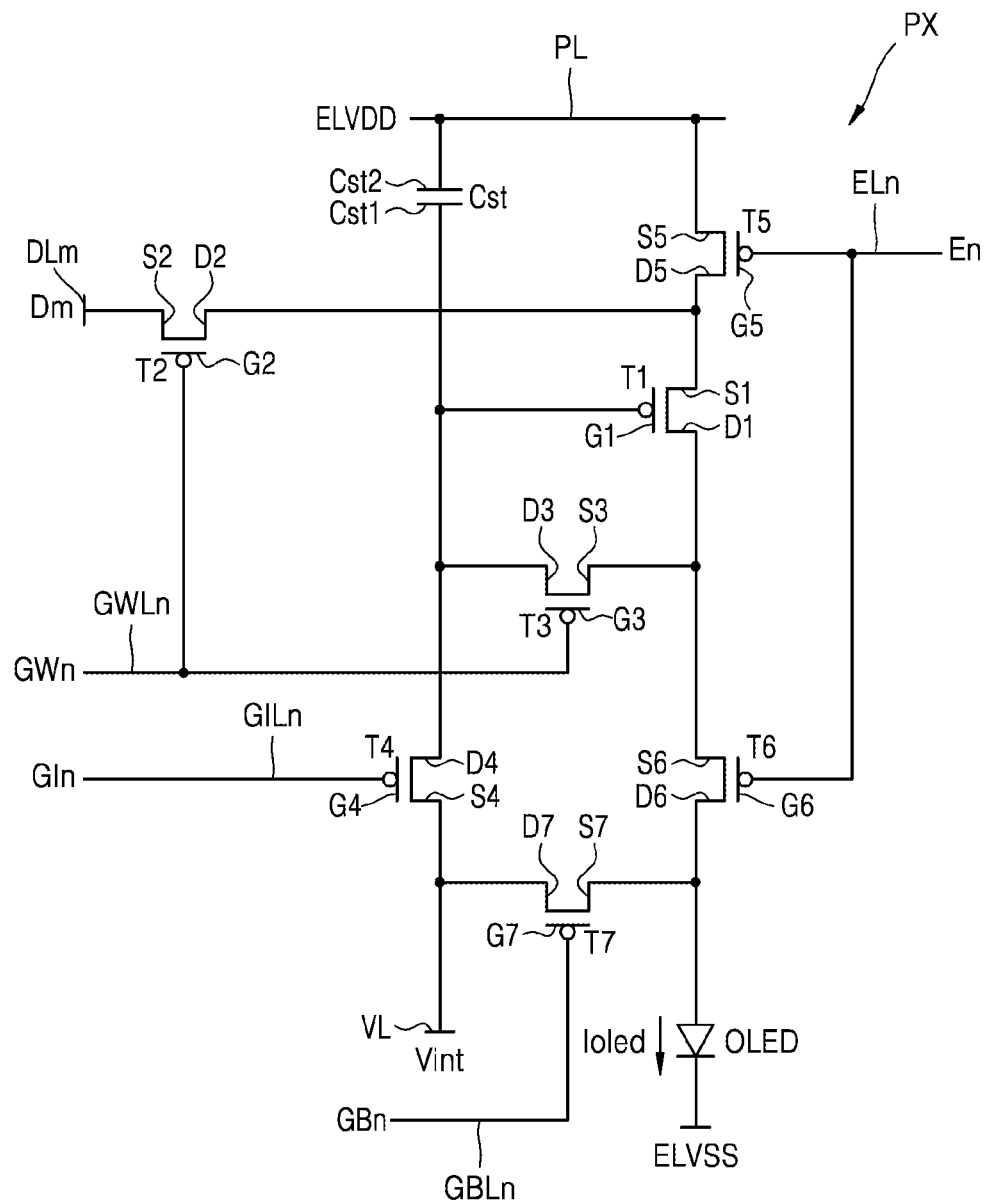
FIG. 2 is an equivalent circuit diagram of a pixel, according to an embodiment pixel.

FIG. 2 is an equivalent circuit diagram of a pixel PX according to an embodiment.

Referring to FIG. 2, the pixel PX includes a pixel circuit including first to seventh transistors T1 to T7 and a capacitor Cst, and a light-emitting unit connected to the pixel circuit. The light-emitting unit may be an OLED. The OLED may include a first electrode, a second electrode, and an emission layer between the first and second electrodes. The second electrode of the OLED is connected to a second power source that supplies the second power voltage ELVSS.

The pixel PX is connected to a first scan line GILn transmitting the first scan signal GIn to the fourth transistor T4, a second scan line GWLn transmitting the second scan signal GWn to the second transistor T2 and the third transistor T3, an emission control line ELn transmitting an emission control signal En to the fifth transistor T5 and the sixth transistor T6, a data line DLm transmitting data signals Dm, a driving voltage line PL transmitting the first power voltage ELVDD, an initialization voltage line VL transmitting an initialization voltage Vint for initializing the first transistor T1, and a third scan line GBLn transmitting the third scan signal GBn to the seventh transistor T7. The data line DLm may be an odd data line or an even data line.

The first transistor T1 includes a gate electrode G1 connected to a first electrode Cst1 of the capacitor Cst, a first electrode S1 connected to the driving voltage line PL via the fifth transistor T5, and a second electrode D1 electrically connected to a first electrode of the OLED via the sixth transistor T6. The first transistor T1 may function as a driving transistor, and may receive data signals according to a switching operation of the second transistor T2 and apply current to the OLED.

The second transistor T2 includes a gate electrode G2 connected to the second scan line GWLn, a first electrode S2 connected to the data line DLm, and a second electrode D2 connected to the first electrode S1 of the first transistor T1. The second transistor T2 may be turned on according the second scan signal GWn received via the second scan line GWLn, and may perform a switching operation of transmitting data signals transmitted via the data line DLm to the first electrode S1 of the first transistor T1.

The third transistor T3 includes a gate electrode G3 connected to the second scan line GWLn, a first electrode S3 connected to the second electrode D1 of the first transistor T1, and a second electrode D3 connected to the first electrode Cst1 of the capacitor Cst, a second electrode D4 of the fourth transistor T4, and the gate electrode G1 of the first transistor T1. The third transistor T3 may be turned on according to the second scan signal GWn received via the second scan line GWLn, and diode-connect the first transistor T1.

The fourth transistor T4 includes a gate electrode G4 connected to the first scan line GILn, a first electrode S4 connected to the initialization voltage line VL, and the second electrode D4 connected to the first electrode Cst1 of the capacitor Cst, the second electrode D3 of the third transistor T3, and the gate electrode G1 of the first transistor T1. The fourth transistor T4 may be turned on according to the first scan signal Gin received via the first scan line GILn, and perform an initialization operation of initializing a gate voltage of the first transistor T1 by transmitting the initialization voltage Vint to the gate electrode G1 of the first transistor T1.

The fifth transistor T5 includes a gate electrode G5 connected to the emission control line ELn, a first electrode S5 connected to the driving voltage line PL, and a second electrode D5 connected to the first electrode S1 of the first transistor T1 and the second electrode D2 of the second transistor T2.

The sixth transistor T6 includes a gate electrode G6 connected to the emission control line ELn, a first electrode S6 connected to the second electrode D1 of the first transistor T1 and the first electrode S3 of the third transistor T3, and a second electrode D6 connected to the first electrode of the OLED.

The fifth and sixth transistors T5 and T6 may be simultaneously or concurrently turned on according to the emission control signal En received via the emission control line ELn, and thus, current may flow through the OLED.

The seventh transistor T7 includes a gate electrode G7 connected to the third scan line GBLn, a first electrode S7 connected to the second electrode D6 of the sixth transistor T6 and the first electrode of the OLED, and a second electrode D7 connected to the initialization voltage line VL. The seventh transistor T7 may be turned on according to the third scan signal GBn received via the third scan line GBLn, and may perform an initialization operation of initializing a voltage of the first electrode of the OLED by transmitting the initialization voltage Vint to the first electrode of the OLED.

The third scan line GBLn connected to the gate electrode G7 of the seventh transistor T7 may be the first scan line GILn or the second scan line GWLn, and the third scan signal GBn may be the first scan signal GIn or the second scan signal GWn.

The capacitor Cst may include the first electrode Cst1 connected to the gate electrode G1 of the first transistor T1, the second electrode D3 of the third transistor T3, and the second electrode D4 of the fourth transistor T4, and a second electrode Cst2 connected to the driving voltage line PL.

An operation process will be briefly described below. First, the first scan signal Gin is applied to the first scan line GILn, and thus the fourth transistor T4 is turned on. When the fourth transistor T4 is turned on, the initialization voltage Vint is applied to the gate electrode G1 of the first transistor T1, and thus, a voltage of the gate electrode G1 of the first transistor T1 is initialized as the initialization voltage Vint.

Second, the second scan signal GWn is applied to the second scan line GWLn, and thus the second transistor T2 and the third transistor T3 are turned on. When the third transistor T3 is turned on, the first transistor T1 is diode-connected. When the first transistor T1 is diode-connected, the data signals Dm and a voltage corresponding to a threshold voltage of the first transistor T1 are applied to the gate electrode G1 of the first transistor T1. When the second transistor T2 is turned on, the data signals Dm is transmitted from the data line DLm to the first electrode S1 of the first transistor T1.

Third, the third scan signal GBn is applied to the third scan line GBLn, and thus the seventh transistor T7 is turned on. When the seventh transistor T7 is turned on, the first electrode of the OLED is initialized as the initialization voltage Vint.

Fourth, the emission control signal En is applied to the emission control line ELn, and thus the fifth transistor T5 and the sixth transistor T6 are turned on. Then, in response to the voltage applied to the gate electrode G1, the first transistor T1 controls an amount of current flowing from the first power voltage ELVDD to the second power voltage ELVSS via the OLED. In this case, the OLED generates light with predetermined luminance in response to the amount of current.

Figure 3:
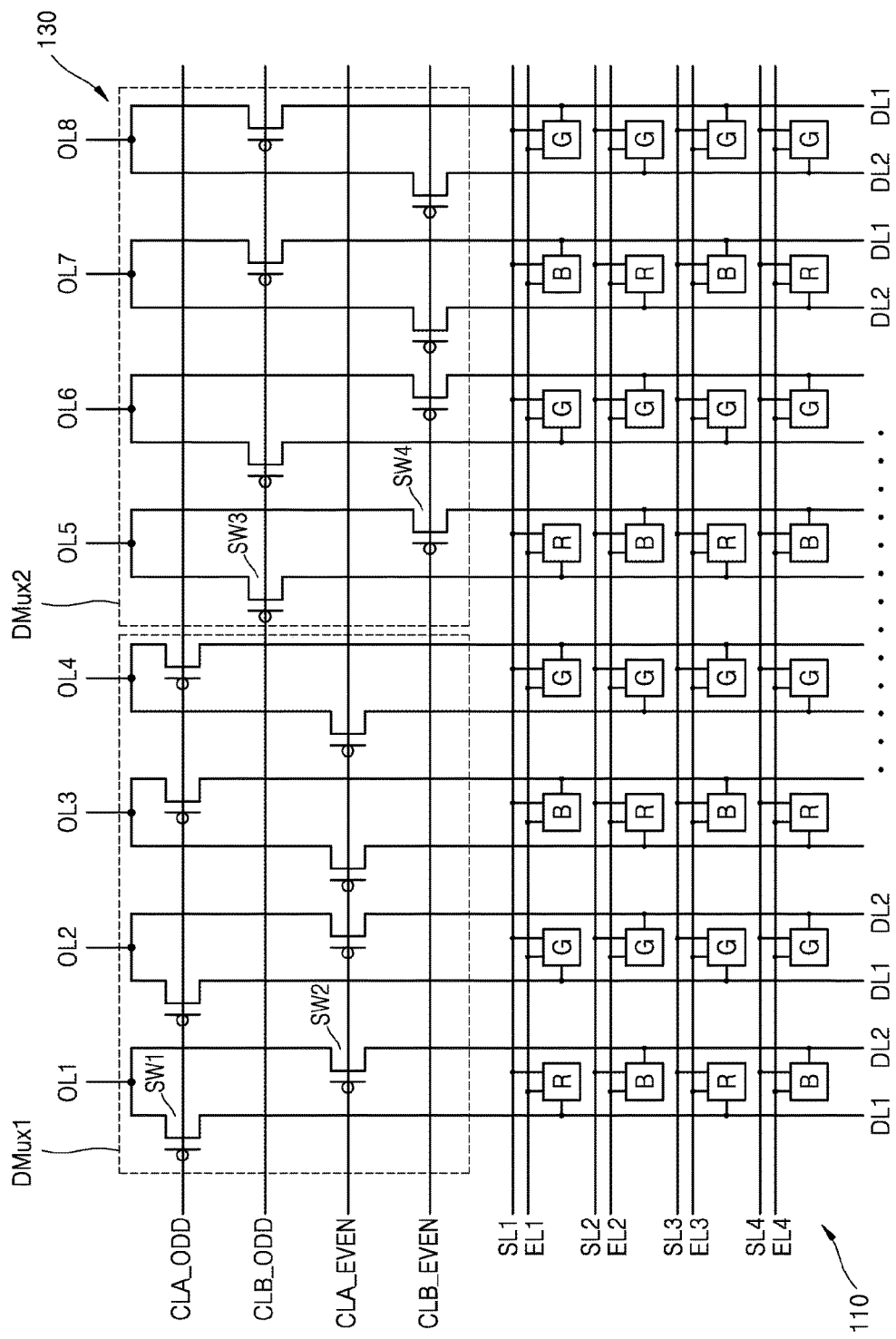
FIG. 3 is a schematic diagram of some components of the display device of FIG. 1.
Figure 4:
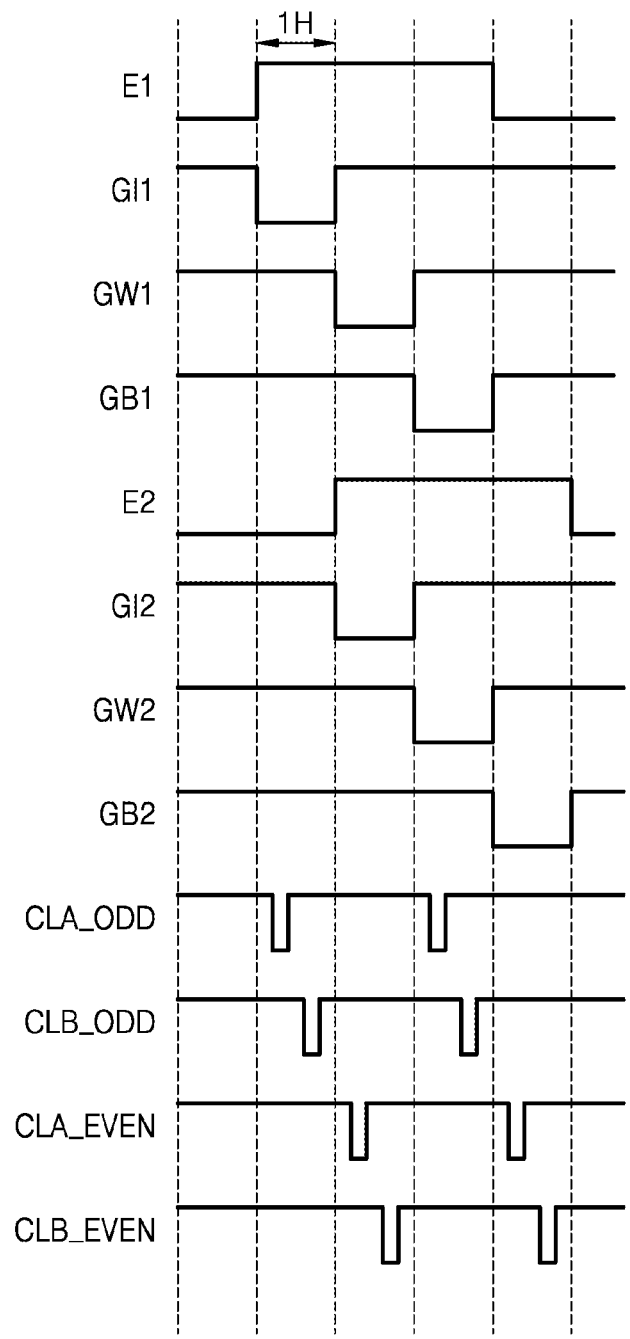
FIG. 4 is a timing diagram for describing a method of driving the display device of FIG. 3.

FIG. 3 is a schematic diagram of some components of the display device 100 of FIG. 1. FIG. 4 is a timing diagram for describing a method of driving the display device 100 of FIG. 3.

The pixel unit 110 includes first pixels, second pixels, and third pixels, which emit light with different colors. The first pixels and the second pixels are alternately arranged in an identical column, and the third pixels are arranged in a column adjacent to the column in which the first and second pixels are arranged. The first pixel may be a red pixel R emitting red light, the second pixel may be a blue pixel B emitting blue light, and the third pixel may be a green pixel G emitting green light. The red pixel R and the blue pixel B are alternately arranged in an identical column, and the green pixel G is arranged in a column adjacent to the column in which the red pixel R and the blue pixel B are arranged.

Two data lines, i.e., the first data line DL1 connected to the pixel PX in the odd row and the second data line DL2 connected to the pixel PX in the even row, may be substantially parallel to one another in each column. In an embodiment, light emitted by the pixel PX connected to the first data line DL1 may have a different color from light emitted by the pixel PX connected to the second data line DL2. In another embodiment, the pixel PX connected to the first data line DL1 may have a different size from the pixel PX connected to the second data line DL2.

In a first column of FIG. 3, the red pixel R is connected to the first data line DL1, the blue pixel B is connected to the second data line DL2. In a third column of FIG. 3, the blue pixel B is connected to the first data line DL1, and the red pixel R is connected to the second data line DL2. In second and fourth columns of FIG. 3, the green pixel G is connected to the first and second data lines DL1 and DL2.

In the embodiment of FIG. 3, an alternating order of the first and second data lines DL1 and DL2 in the first and second columns is different from an alternating order of the first and second data lines DL1 and DL2 in the third and fourth columns. However, the described technology is not limited thereto. The alternating order of the first and second data lines DL1 and DL2 may be identical in a row direction.

The data allocator 130 may be provided between first to fourth output lines OL1 to OL4 and the first and second data lines DL1 and DL2 corresponding to the first to eighth columns, and include a demultiplexer that includes first to fourth switches SW1 to SW4. The demultiplexer may be provided on every eight columns.

The first switch SW1 may be turned on by a first clock signal CLA_ODD, and apply data signals applied to the first to fourth output lines OL1 to OL4 to each of the first data lines DL1 of the first to fourth columns. The second switch SW2 may be turned on by a second clock signal CLA_EVEN, and apply the data signals applied to the first to fourth output lines OL1 to OL4 to each of the second data lines DL2 of the first to fourth columns. The third switch SW3 may be turned on by a third clock signal CLB_ODD, and apply the data signals applied to the first to fourth output lines OL1 to OL4 to each of the first data lines DL1 of the fifth to eighth columns. The fourth switch SW4 may be turned on by a fourth clock signal CLB_EVEN, and apply the data signals applied to the first to fourth output lines OL1 to OL4 to each of the second data lines DL2 of the fifth to eighth columns.

While the first scan signal GIn is being applied to the pixel PX, corresponding data signals are applied to a corresponding (i.e., connected) first data line DL1 or a corresponding (i.e., connected) second data line DL2. Afterwards, while the second scan signal GWn is being applied to the pixel PX, the data signals applied to the corresponding first data line DL1 or the corresponding second data line DL2 may be applied to the pixel PX via the second transistor T2. The first scan signal GI, the second scan signal GWn, and the third scan signal GB may be sequentially applied along rows in 1 horizontal period (1H) units.

Referring to FIG. 4, while a first scan signal GI1 is being applied to the pixels PX of a first row, the first clock signal CLA_ODD and the third clock signal CLB_ODD are applied to the data allocator 130. The first switches SW1 may be turned on by the first clock signal CLA_ODD, and the third switches SW3 are turned on by the third clock signal CLB_ODD. Accordingly, data signals of the first row are applied to the first data lines DL1. Next, a second scan signal GW1 is applied to the pixels PX of the first row, and the data signals stored in the first data lines DL1 are applied to the pixels PX of the first row. Similarly, while a first scan signal GI2 is being applied to the pixels PX of a second row, the second clock signal CLA_EVEN and the fourth clock signal CLB_EVEN are applied to the data allocator 130. The second switches SW2 are turned on by the second clock signal CLA_EVEN, and the fourth switches SW4 are turned on by the fourth clock signal CLB_EVEN. Accordingly, data signals of the second row are applied to the second data lines DL2. Next, a second scan signal GW2 is applied to the pixels PX in the second row, and the data signals stored in the second data lines DL2 are applied to the pixels PX of the second row. The second scan signal GW1 applied to the pixels PX of the first row mutually overlap the first scan signal GI2 applied to the pixels PX of the second row. Also, although not illustrated, the second scan signal GW2 applied to the pixels PX of the second row mutually overlap a first scan signal GI3 applied to the pixels PX of a third row.

That is, a data line in the display device according to an embodiment holds a data signal for 2H.

The described technology is not limited to the aforementioned configuration of the demultiplexer and a timing diagram of a clock signal. Various embodiments of the configuration of the demultiplexer and timing of the clock signal may be provided to drive a pixel unit in which two data lines are arranged in one pixel.

Figure 5:
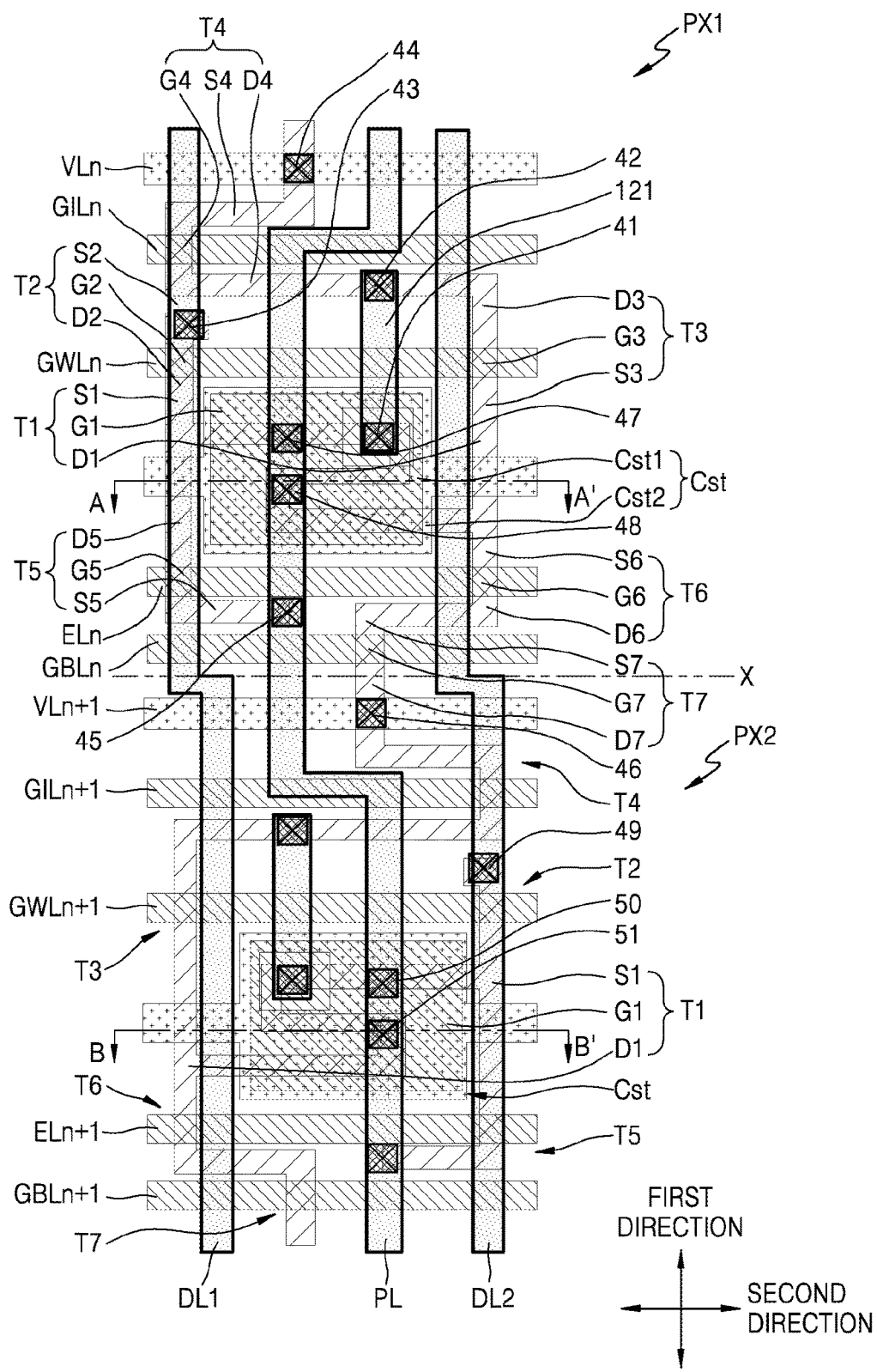
FIG. 5 is a schematic plan view of a first pixel in an odd row and a second pixel in an even row on an arbitrary column, according to an embodiment.
Figure 6:
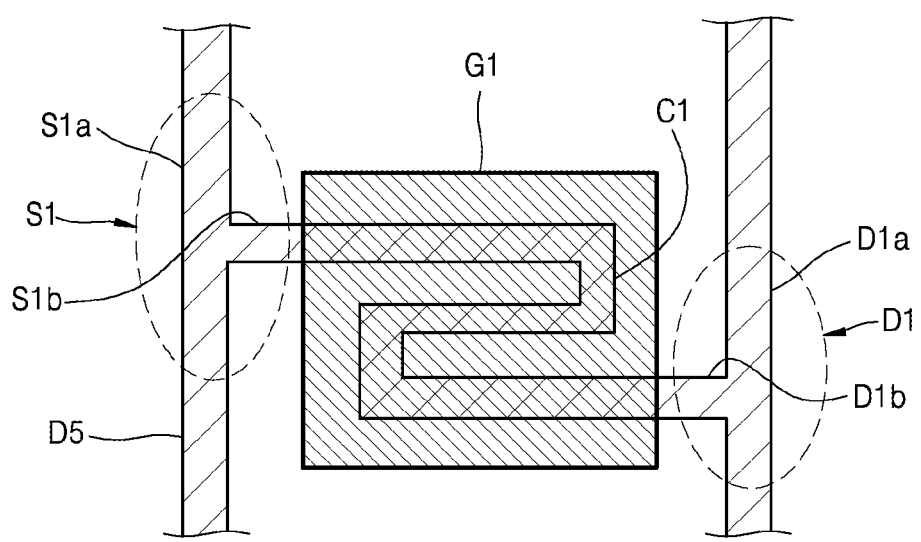
FIG. 6 is an enlarged plan view of a first transistor of the first pixel of FIG. 5.

FIG. 5 is a schematic plan view of a first pixel PX1 in an odd row and a second pixel PX2 in an even row on an arbitrary column, according to an embodiment. FIG. 6 is an enlarged plan view of a first transistor T1 of the first pixel PX1 of FIG. 5;

FIG. 5 shows the first pixel PX1 in an n-th row of an arbitrary column on a substrate and the second pixel PX2 in an (n+1)-th row of the arbitrary column on the substrate. The n-th row may be an odd row, and the (n+1)-th row may be an even row adjacent to the odd row. In FIG. 5, the OLED is not illustrated, and only a pixel circuit is illustrated.

The first pixel PX1 and the second pixel PX2 respectively include initialization voltage lines VLn and VLn+1 applying the initialization voltage Vint, first scan lines GILn and GILn+1 applying the first scan signal GIn, second scan lines GWLn and GWLn+1 applying the second scan signal GWn, emission control lines ELn and ELn+1 applying the emission control signal En, and third scan lines GBLn and GBLn+1 applying the third scan signal GBn. The initialization voltage lines VLn and VLn+1, the first scan lines GILn and GILn+1, the second scan lines GWLn and GWLn+1, the emission control lines ELn and ELn+1, and the third scan lines GBLn and GBLn+1 may be spaced apart from each other by a predetermined distance and parallel to one another in a second direction (row direction). The first data line DL1 at a left side and the second data line DL2 at a right side may be spaced apart with a capacitor Cst in between, and parallel to one another in a first direction (column direction) that is perpendicular to the second direction. The driving voltage line PL may partially overlap the capacitor Cst, may be between the first and second data lines DL1 and DL2, and may be approximately parallel to the first and second data lines DL1 and DL2 in the first direction. The first pixel PX1 is connected to the first data line DL1. The second pixel PX2 is connected to the second data line DL2.

According to the embodiment of FIG. 5, the first data line DL1 is at the left side and the second data line DL2 is at the right side. However, the embodiments are not limited thereto, and the first data line DL1 may be at the right side and the second data line DL2 may be at the left side.

The first and second pixels PX1 and PX2 may have a vertical flip structure with respect to a dashed line X. That is, a left and right arrangement of first to seventh transistors T1 to T7 of the first pixel PX1 is opposite to that of the second pixel PX2. However, a connection relationship between the first to seventh transistors T1 to T7 and the capacitor Cst is identical. Hereinafter, the connection relationship between the first to seventh transistors T1 to T7 and the capacitor Cst of the first pixel PX1 will be mainly described, but the description may also apply to that of the second pixel PX2.

Transistors are formed on a semiconductor layers having various shapes. The semiconductor layer may be formed by using, for example, polysilicon. The semiconductor layer may include a channel area that is not doped with impurities and source and drain areas that are formed at two sides of the channel area by doping with impurities. The impurity may vary according to a type of the transistor. For example, the impurity may include an n-type impurity or a p-type impurity.

The first transistor T1 may include the gate electrode G1, the first electrode S1, and the second electrode D1. The first electrode S1 may correspond to a source area doped with impurities in the semiconductor layer, and the second electrode D1 may correspond to a drain area doped with impurities in the semiconductor layer. The gate electrode G1 may overlap a channel area. The gate electrode G1 may be electrically connected to a connecting electrode 121 via a contact hole 41, and the connecting electrode 121 may be electrically connected to the second electrode D3 of the third transistor T3 and the second electrode D4 of the fourth transistor T4 via the contact hole 42.

A semiconductor layer of the first transistor T1 may be curved. According to the example of FIG. 5, the semiconductor layer of the first transistor T1 of the first pixel PX1 may be arranged in the shape of an inverse 'S,' and a semiconductor layer of the first transistor T1 of the second pixel PX2 may be arranged in the shape of the letter 'S.' By curving the semiconductor layer, the semiconductor layer may be elongated in a small area. Therefore, since the semiconductor layer of the first transistor T1 may have a long channel area, a driving range of a gate voltage applied to the gate electrode G1 may be widened. When the driving range of the gate voltage is wide, light emitted by the OLED may be more thoroughly adjusted by changing the magnitude of the gate voltage, thereby increasing the resolution of the display device and improving display quality. The shape of the semiconductor layer of the first transistor T1 is not limited to above, and may correspond to the letter 'M' or 'W.'

The first electrode S1 of the first transistor T1 of the first pixel PX1 may be located at a left side of the capacitor Cst, and the second electrode D1 may be located at a right side of the capacitor Cst. The first electrode S1 of the first transistor T1 of the second pixel PX2 may be located at the right side of the capacitor Cst, and the second electrode D1 may be located at the left side of the capacitor Cst.

Referring to FIGS. 5 and 6, the first electrode S1 of the first transistor T1 includes a first area S1a in the first direction and a second area S1b in the second direction. The second electrode D1 of the first transistor T1 includes a first area D1a in the first direction and a second area D1b of the second direction. A channel area C1 of the first transistor T1 is curved between the first electrode S1 and the second electrode D1. A gate electrode G1 of the first transistor T1 overlaps the channel area C1. The gate electrode G1 may also function as the first electrode Cst1 of the capacitor Cst.

The second transistor T2 includes the gate electrode G2, the first electrode S2, and the second electrode D2. The first electrode S2 may correspond to a source area doped with impurities in the semiconductor layer, and the second electrode D2 may correspond to a drain area doped with impurities in the semiconductor layer. The gate electrode G2 may overlap a channel area. The first electrode S2 may be electrically connected to the first data line DL1 via a contact hole 43. The second electrode D2 may be connected to the first electrode S1 of the first transistor T1 and the second electrode D5 of the fifth transistor T5. The gate electrode G2 may be formed from a portion of the second scan line GWLn. The first electrode S2 of the second transistor T2 of the second pixel PX2 may be electrically connected to the second data line DL2 via a contact hole 49. The second transistor T2 of the first pixel PX1 may be located at the left side, and the second transistor T2 of the second pixel PX2 may be located at the right side.

The third transistor T3 includes the gate electrode G3, the first electrode S3, and the second electrode D3. The first electrode S3 may correspond to a source area doped with impurities in the semiconductor layer, and the second electrode D3 may correspond to a drain area doped with impurities in the semiconductor layer. The gate electrode G3 may overlap a channel area, and be formed from a portion of the second scan line GWLn. The third transistor T3 of the first pixel PX1 may be located at the right side, and the third transistor T3 of the second pixel PX2 may be located at the left side.

The fourth transistor T4 includes the gate electrode G4, the first electrode S4, and the second electrode D4. The first electrode S4 may correspond to a source area doped with impurities in the semiconductor layer, and the second electrode D4 may correspond to a drain area doped with impurities in the semiconductor layer. The first electrode S4 may be electrically connected to the initialization voltage line VLn via a contact hole 44. The gate electrode G4 may overlap a channel area, and may be formed from a portion of the first scan line GILn. The initialization voltage line VLn may be electrically connected to a second electrode of the seventh transistor T7 on a previous row (even row) via the contact hole 44. The fourth transistor T4 of the first pixel PX1 may be located at the left side, and the fourth transistor T4 of the second pixel PX2 may be located at the right side.

The fifth transistor T5 includes the gate electrode G5, the first electrode S5, and the second electrode D5. The first electrode S5 may correspond to a source area doped with impurities in the semiconductor layer, and the second electrode D5 may correspond to a drain area doped with impurities in the semiconductor layer. The gate electrode G5 may overlap a channel area. The first electrode S5 may be connected to the driving voltage line PL via a contact hole 45. The gate electrode G5 may be formed from a portion of the emission control line ELn. The fifth transistor T5 of the first pixel PX1 may be located at the left side, and the fifth transistor T5 of the second pixel PX2 may be located at the right side.

The sixth transistor T6 includes the gate electrode G6, the first electrode S6, and the second electrode D6. The first electrode S6 may correspond to a source area doped with impurities in the semiconductor layer, and the second electrode D6 may correspond to a drain area doped with impurities in the semiconductor layer. The gate electrode G6 may overlap a channel area. The second electrode D6 may be electrically connected to the first electrode of the OLED via a via hole. The gate electrode G6 may be formed from a portion of the emission control line ELn. The sixth transistor T6 of the first pixel PX1 may be located at the right side, and the sixth transistor T6 of the second pixel PX2 may be located at the left side.

The seventh transistor T7 includes the gate electrode G7, the first electrode S7, and the second electrode D7. The first electrode S7 may correspond to a source area doped with impurities in the semiconductor layer, and the second electrode D7 may correspond to a drain area doped with impurities in the semiconductor layer. The gate electrode G7 may overlap a channel area. The first electrode S7 may be connected to the second electrode D6 of the sixth transistor T6. Also, the first electrode S7 may be electrically connected to the first electrode of the OLED via a via hole. The second electrode D7 may be connected to the initialization voltage line VLn+1 in a following row (i.e., an even row), via a contact hole 46. The seventh transistor T7 of the first pixel PX1 may be located at the right side, and the seventh transistor T7 of the second pixel PX2 may be located at the left side.

The connecting electrode 121 connected to the contact hole 41 may connect the first electrode Cst1 of the capacitor Cst of the first pixel PX1 to the second electrode D3 of the third transistor T3 and the second electrode D4 of the fourth transistor T4. The first electrode Cst1 of the capacitor Cst may also function as the gate electrode G1 of the first transistor T1. The second electrode Cst2 of the capacitor Cst of the first pixel PX1 may be connected to the driving voltage line PL via contact holes 47 and 48, and receive the first power voltage ELVDD from the driving voltage line PL. The second electrode Cst2 of the capacitor Cst of the second pixel PX2 may be connected to the driving voltage line PL via contact holes 50 and 51, and receive the first power voltage ELVDD from the driving voltage line PL The first electrode Cst1 of the capacitor Cst may be spaced apart from an adjacent pixel, have a quadrilateral shape, and may be formed on the same level (same layer) with the same material as the first scan line GILn, the second scan line GWLn, the emission control line ELn, and the gate electrodes G1 to G7 of the first to seventh transistors T1 to T7.

The second electrode Cst2 of the capacitor Cst may be connected to the second electrodes Cst2 of pixels adjacently arranged in the second direction, i.e., to the second electrodes Cst2 of the pixels in an identical row. The second electrode Cst2 of the capacitor Cst may overlap the first electrode Cst1 such that the first electrode Cst1 is completely covered, and may vertically overlap the first transistor T1. In order to create an area for the capacitor Cst which is reduced due to the curved semiconductor layer of the first transistor T1, the capacitor Cst may overlap the semiconductor layer of the first transistor T1, and thus capacitance may be generated even under a high resolution state.

The first data line DL1 may be arranged in the first direction on the left side of the first and second pixels PX1 and PX2. The second data line DL2 may be arranged in the first direction on the right side of the first and second pixels PX1 and PX2. The first data line DL1 may be connected to the second transistor T2 of the first pixel PX1, and the second data line DL2 may be connected to the second transistor T2 of the second pixel PX2. The first and second data lines DL1 and DL2 may be formed on the same level (same layer) with the same material as the driving voltage line PL.

The first data line DL1 in the first pixel PX1 may overlap a semiconductor layer that is arranged in the first direction on a left side of the capacitor Cst of the first pixel PX1. The first data line DL1 in the second pixel PX2 may be shifted rightward and provided between a semiconductor layer arranged in the first direction on a left side of the capacitor Cst of the second pixel PX2 and the capacitor Cst. For example, the first data line DL1 may overlap the first area S1a of the first electrode S1 of the first transistor T1 of the first pixel PX1. The first data line DL1 may partially overlap a semiconductor layer of the second transistor T2, a semiconductor layer of the fourth transistor T4, and a semiconductor layer of the fifth transistor T5 of the first pixel PX1. The first data line DL1 may partially overlap the second area D1b of the second electrode D1 of the first transistor T1 of the second pixel PX2, but not overlap the first area D1a.

The second data line DL2 in the first pixel PX1 may be provided between the capacitor Cst of the first pixel PX1 and the semiconductor layer that is arranged in the first direction on a right side of the capacitor Cst of the first pixel PX1. The second data line DL2 in the second pixel PX2 may be shifted rightward and thus overlap the semiconductor layer that is arranged in the first direction on a right side of the capacitor Cst of the second pixel PX2. For example, the second data line DL2 may overlap the first area S1a of the first electrode S1 of the first transistor T1 of the second pixel PX2. The second data line DL2 may partially overlap a semiconductor layer of the second transistor T2, a semiconductor layer of the fourth transistor T4, and a semiconductor layer of the fifth transistor T5 of the second pixel PX2. The second data line DL2 may partially overlap the second area D1b of the second electrode D1 of the first transistor T1 of the first pixel PX1, but not overlap the first area D1a.

The driving voltage line PL may extend in the first direction between the first and second data lines DL1 and DL2 of the first pixel PX1, and may be located near the first data line DL1. The driving voltage line PL may extend in the first direction between the first and second data lines DL1 and DL2 of the second pixel PX2, and may be located near the second data line DL2.

The second electrodes Cst2 of the capacitors Cst may be connected to one another among pixels on an identical row that are nearby one another in the second direction, and electrically connected to the driving voltage line PL. Accordingly, the driving voltage line PL may function as a driving voltage line in the first direction, and the second electrode Cst2 of the capacitor Cst may function as a driving voltage line in the second direction, and the driving voltage line PL may have a mesh structure in overall. Also, the driving voltage line PL may be electrically connected to the fifth transistor T5.

The initialization voltage line VLn may extend in the second direction and located near the first scan line GILn. The initialization voltage line VLn may be electrically connected to the first electrode S4 of the fourth transistor T4 via the contact hole 44. The initialization voltage line VLn may be formed on the same level (same layer) with the same material as the second electrode Cst2 of the capacitor Cst.

Figure 7:
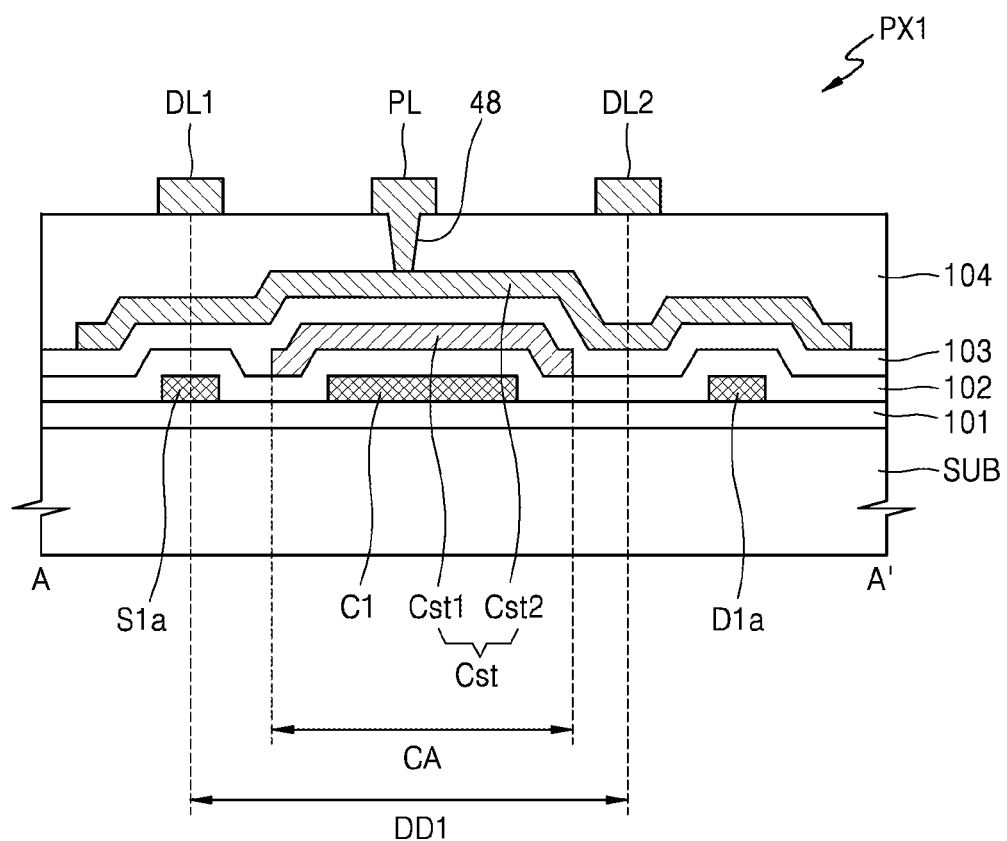
FIGS. 7 and 8 are cross-sectional views of the first and second pixels, cut along the lines A-A' and B-B' of FIG. 5.
Figure 8:
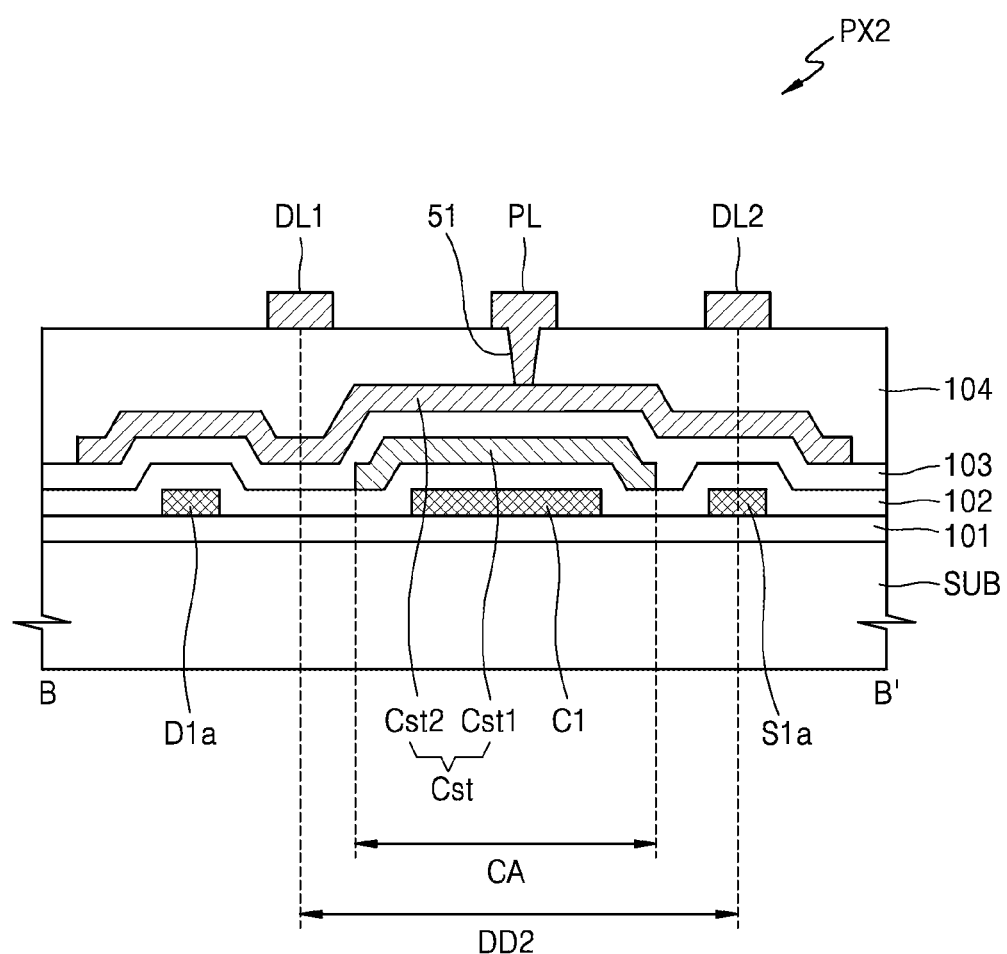

FIGS. 7 and 8 are cross-sectional views of the first and second pixels PX1 and PX2, cut along the lines A-A' and B-B' of FIG. 5.

A buffer layer 101 is provided on a substrate SUB, and a semiconductor layer of each of the first to seventh transistors T1 to T7 is provided on the buffer layer 101. FIGS. 7 and 8 show the first electrode S1 of the first transistor T1 in the first direction (i.e., the first area S1a), the second electrode D1 in the first direction (i.e., the first area D1a), and a channel C1 between the first and second electrodes S1 and D1.

A first insulating layer 102 may be provided on the semiconductor layer. The first insulating layer 102 may function as a gate insulating layer. The first insulating layer 102 may be formed as a single inorganic insulating layer or a plurality of inorganic insulating layers.

Lines, i.e., the first scan lines GILn and GILn+1, the second scan lines GWLn and GWLn+1, the third scan lines GBLn and GBLn+1, the emission control lines ELn and ELn+1, the gate electrodes G1 to G7 of the first to seventh transistors T1 to T, and the first electrode Cst1 of the capacitor Cst, may be provided on the first insulating layer 102. FIGS. 7 and 8 show the first electrode Cst1 of the capacitor Cst that may function as the gate electrode G1 of the first transistor T1.

A second insulating layer 103 may be provided on the lines. The second insulating layer 103 may be formed as a single inorganic insulating layer or a plurality of inorganic insulating layers.

The second electrode Cst2 of the capacitor Cst and the initialization voltage lines VLn and VLn+1 may be provided on the second insulating layer 103. FIGS. 7 and 8 show the second electrode Cst2 of the capacitor Cst.

A third insulating layer 104 may be provided on the second electrode Cst2 of the capacitor Cst. The third insulating layer 104 may be formed as a single organic insulating layer or a plurality of organic insulating layers.

The first data line DL1, the second data line DL2, and the driving voltage line PL may be provided on the third insulating layer 104. FIGS. 7 and 8 show the first data line DL1, the second data line DL2, and the driving voltage line PL that is connected to the second electrode Cst2 of the capacitor Cst via the contact holes 48 and 51.

As shown in FIG. 7, in the first pixel PX1 in an odd row, the first data line DL1 may overlap the first electrode S1 (in particular, the first area S1a) of the first transistor T1, but the second data line DL2 may not overlap the second electrode D1 (in particular, the first area D1a) of the first transistor T1. As shown in FIG. 8, in the second pixel PX2 in an even row, the second data line DL2 may overlap the first electrode S1 (in particular, the first area S1a) of the first transistor T1, but the first data line DL1 may not overlap the second electrode D1 (in particular, the first area D1a) of the first transistor T1.

According to an embodiment, the first and second data lines DL1 and DL2 in the first pixel PX1 and the first and second data lines DL1 and DL2 in the second pixel PX2 are shifted by a predetermined distance so that each of the first and second data lines DL1 and DL2 overlap the first electrode S1 of the first transistor T1 in the first direction of a pixel to which each of the first and second data lines DL1 and DL2 is connected Accordingly, a distance DD1 between the first and second data lines DL1 and DL2 in the first pixel PX1 may be approximately similar to a distance DD2 between the first and second data lines DL1 and DL2 in the second pixel PX2. According to an embodiment, even when two data lines are provided in one pixel, the two data lines may be spaced apart by a predetermined distance, and thus, crosstalk between two data lines may be reduced and capacitance may be secured. Also, upper and lower pixels may be formed to have a vertical flip structure, and the first and second data lines DL1 and DL2 may be shifted in row units to thus reduce load deflection between the first and second data lines DL1 and DL2. In addition, as shown in FIG. 3, different color pixels connected to a single data line may be independently driven by a demultiplexer to thus reduce data charge difference.

Figure 9:
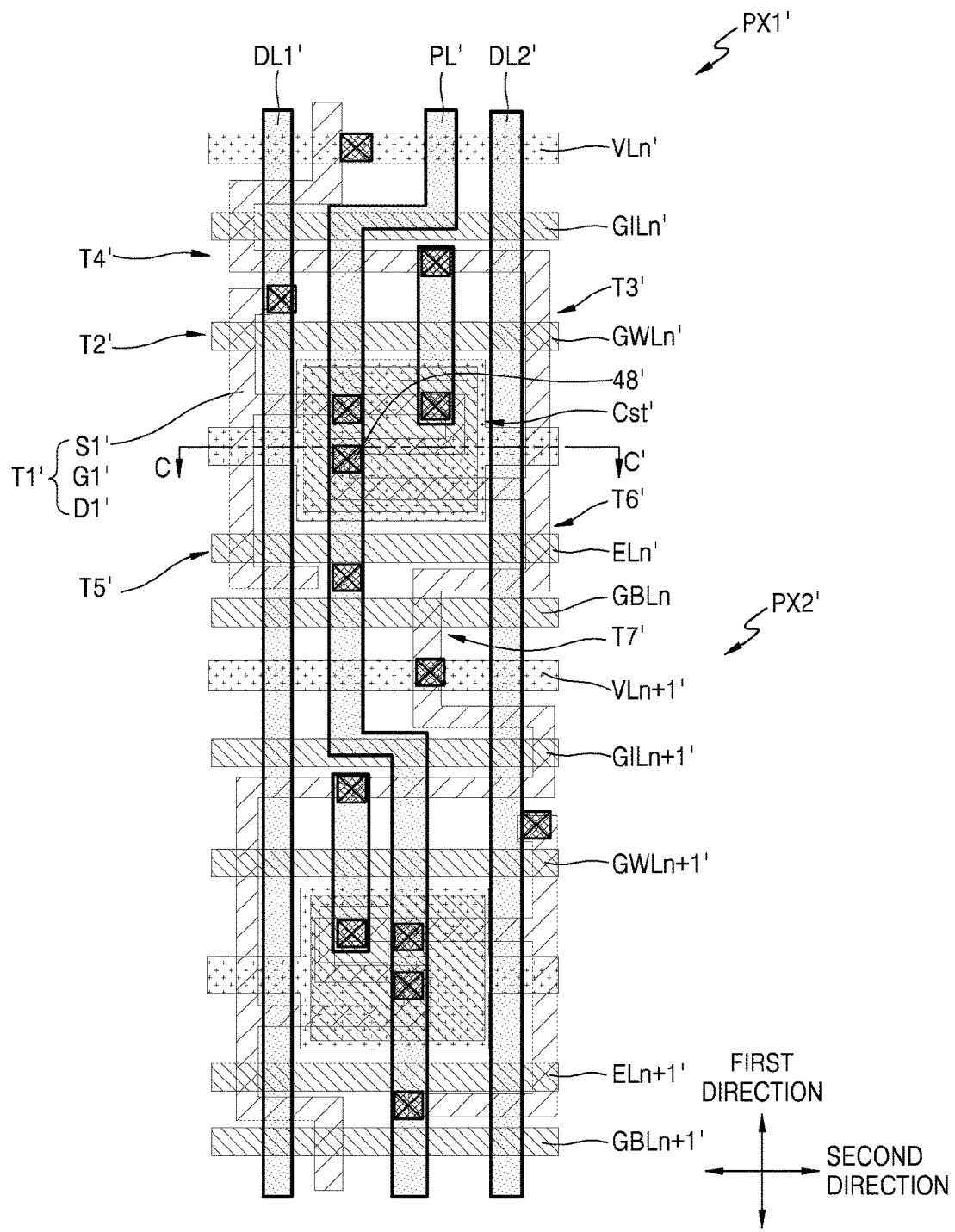
FIG. 9 is a schematic plan view of pixels according to a comparative example.
Figure 10:
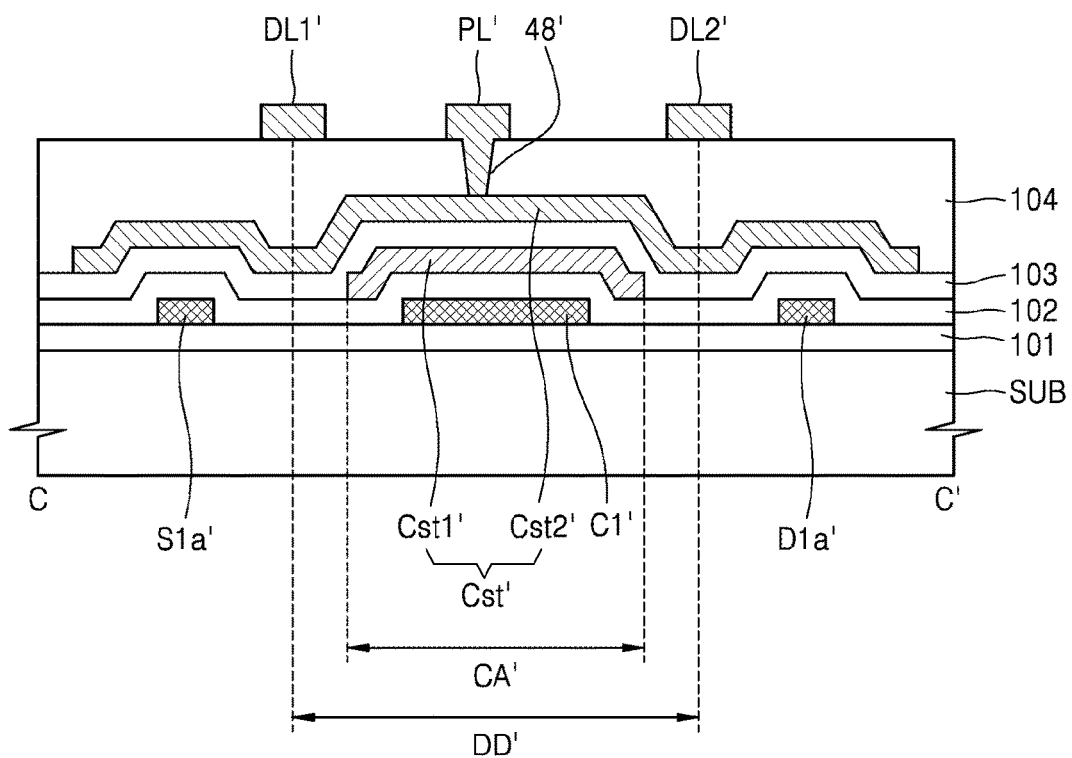
FIG. 10 is a cross-sectional view of the pixel cut along the line C-C' of FIG. 9.

FIG. 9 is a schematic plan view of pixels according to a comparative example. FIG. 10 is a cross-sectional view of the pixel cut along the line C-C' of FIG. 9.

Referring to FIGS. 9 and 10, a buffer layer 101 is provided on the substrate SUB, respective semiconductor layers of first to seventh transistors T1' to T7' of each of a first pixel PX1' in an odd row and a second pixel PX2' in an even row are provided on the buffer layer 101. FIG. 10 shows the first pixel PX1' that includes a first area S1a' of a first electrode S1' of the first transistor T1', a first area D1a' of a second electrode D1', and a channel C1' between the first and second areas S1a' and D1a'.

The first insulating layer 102 is provided on the semiconductor layer. Lines, i.e., gate electrodes G1' to G7' of the first to seventh transistors T1' to T7', first scan lines GILn' and GILn+1', second scan lines GWLn' and GWLn+1', third scan lines GBLn' and GBLn+1', emission control lines ELn' and ELn+1', and a first electrode Cst1' of the capacitor Cst', may be provided on the first insulating layer 102. FIG. 10 shows the first electrode Cst1' of the capacitor Cst' that may function as the gate electrode G1' of the first transistor T1'.

The second insulating layer 103 may be provided on the lines. A second electrode Cst2' of the capacitor Cst' and initialization voltage lines VLn' and VLn+1' may be provided on the second insulating layer 103. FIG. 10 shows the second electrode Cst2' of the capacitor Cst'.

The third insulating layer 104 may be provided on the second electrode Cst2' of the capacitor Cst'. A first data line DL1', a second data line DL2', and a driving voltage line PL' may be provided on the third insulating layer 104 in the first direction.

In the first pixel PX1', the first data line DL1' may be located between the capacitor Cst' and a first area S1a' of a first electrode of the first transistor T1', and in the second pixel PX2', the first data line DL1' may be located between the capacitor Cst' and a second area D1a' of a second electrode of the first transistor T1'. In the second pixel PX2', the second data line DL2' may be located between the capacitor Cst' and the first area S1a' of a first electrode of the first transistor T1', and in the first pixel PX1', the second data line DL2' may be located between the capacitor Cst' and a second area D1a' of a second electrode of the first transistor T1'.

That is, according to the comparative example shown in FIG. 9, in both the first pixel PX1' in the odd row and the second pixel PX2' of the even row, the first and second data lines DL1' and DL2' may be located between semiconductor layers that extend in the first direction on left and right sides of the capacitor Cst'. Accordingly, a distance DD' between the first and second data lines DL1' and DL2' may decrease, and thus crosstalk may occur between the first and second data lines DL1' and DL2'. Also, since the first and second data lines DL1' and DL2' are nearby each other, a size CA' of the capacitor Cst' may be smaller than that when only one data line is provided in one pixel.

However, according to an embodiment shown in FIG. 5, in the first pixel PX1 in the odd row and the second pixel PX2 in the even row, the first data line DL1 or the second data line DL2, whichever that is currently connected to the first pixel PX1 or the second pixel PX2, overlaps the first area S1a of the first electrode of the first transistor T1. Therefore, the distance (DD1=DD2, refer to FIGS. 7 and 8) between the first and second data lines DL1 and DL2 is greater than the distance DD' between the first and second data lines DL1' and DL2' according to the comparative example of FIG. 9. Also, a size CA (CA>CA') of the capacitor Cst may be equal to that when only one data line is provided in one pixel.

Figure 11:
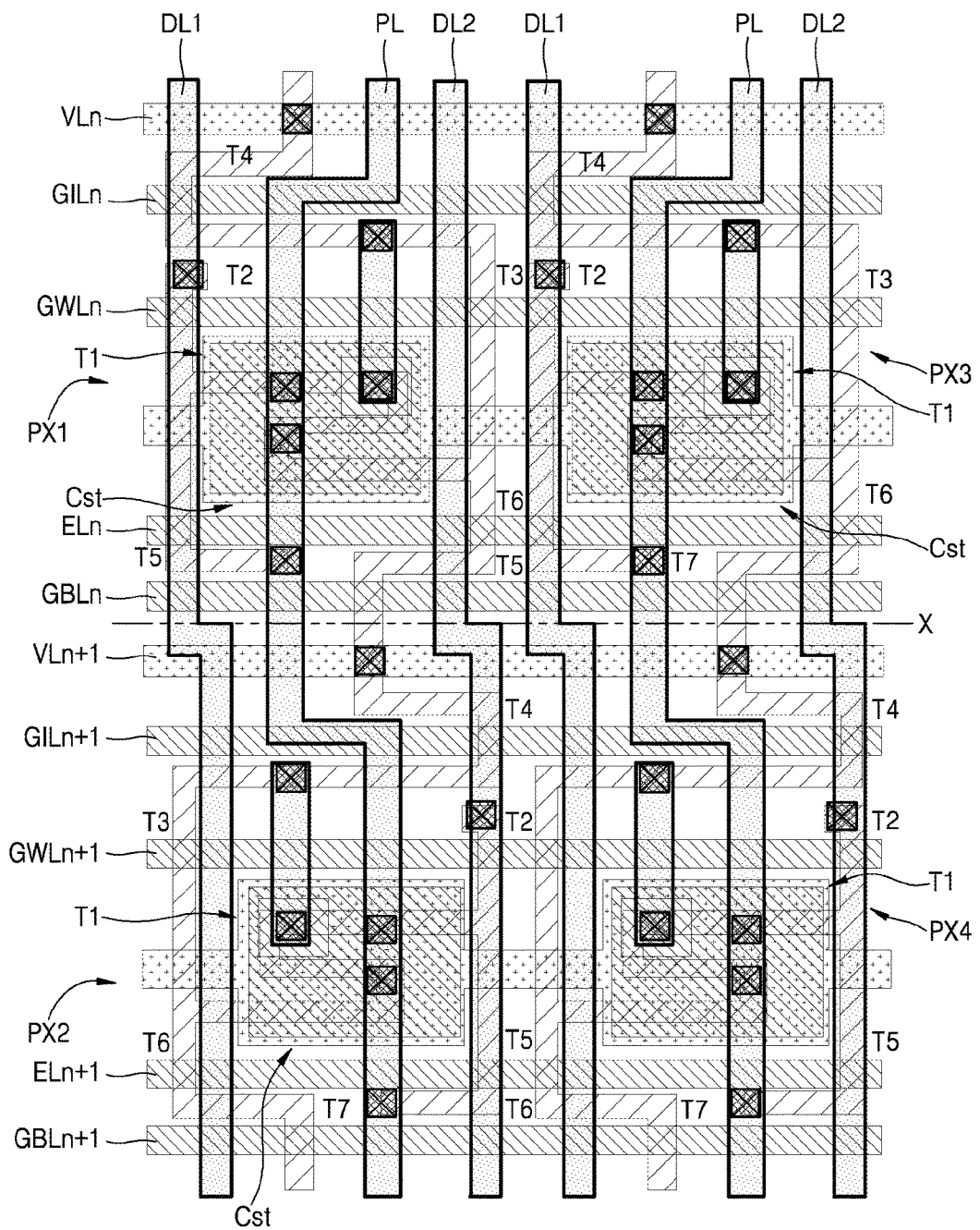
FIGS. 11 and 12 are schematic plan views of an arrangement of pixels, according to an embodiment.
Figure 12:
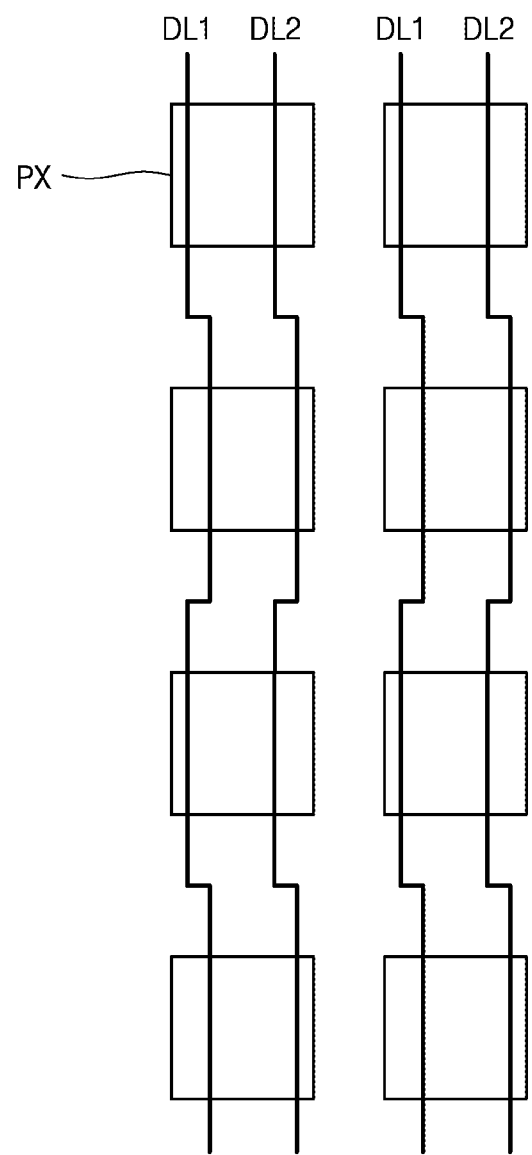

FIGS. 11 and 12 are schematic plan views of an arrangement of pixels, according to an embodiment. For convenience of description, signal lines other than data lines have been omitted in FIG. 12.

FIG. 11 shows first to fourth pixels PX1 to PX4 respectively provided in two adjacent rows and two adjacent columns on a substrate. Hereinafter, for convenience, the adjacent rows and columns will be referred to as a first row, a second row, a first column, and a second column. The first row is an odd row and the second row is an even row.

Based on a line X between the first and second rows, the first pixel PX1 in the first column of the first row forms a vertical flip structure with the second pixel PX2 in the first column of the second row and the third pixel PX3 in the second column of the first row forms a vertical flip structure with the fourth pixel PX4 in the second column of the second row. That is, corresponding transistors are oppositely arranged. Transistors of the first and third pixels PX1 and PX3 in the first row are identically arranged, and the transistors of the second and fourth pixels PX2 and PX4 in the second row are identically arranged.

The first and second data lines DL1 and DL2 may be arranged in each of the columns and be parallel to one another. One of the first and second data lines DL1 and DL2, for example, the first data line DL1 may be connected to pixels in an odd row from among pixels arranged in a column, and may overlap a first electrode S1 in a first direction of a first transistor T1 of each of the connected pixels. The second data line DL2 may be connected to pixels in an even row from among the pixels arranged in the column, and may overlap a first electrode S1 in the first direction of a first transistor T1 of each of the connected pixels.

Accordingly, as shown in FIGS. 11 and 12, according to an embodiment, the first and second data lines DL1 and DL2 in the odd row and the first and second data lines DL1 and DL2 in the even row may be shifted by a certain distance and thus arranged in zigzags in the column direction.

Figure 13:
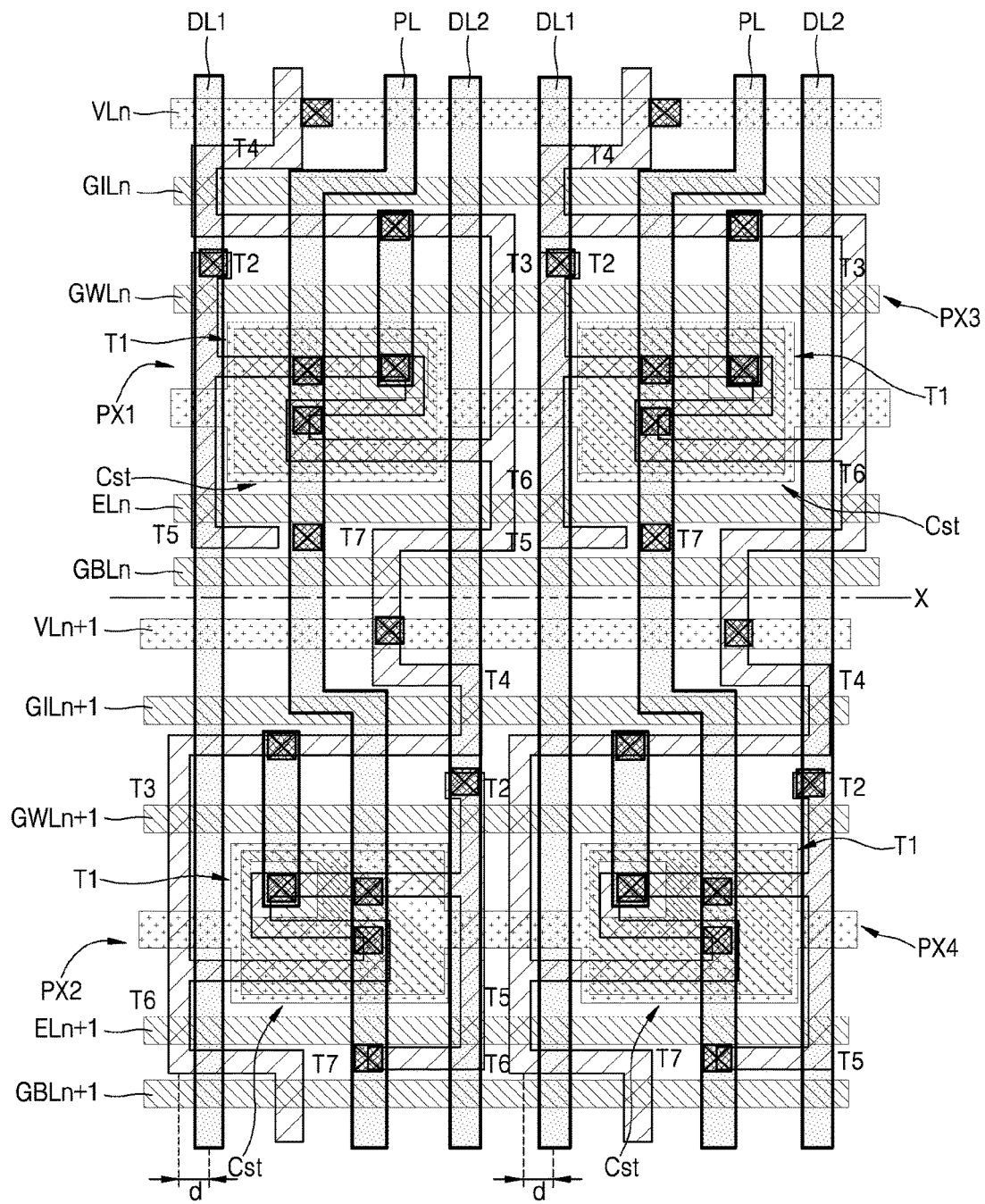
FIGS. 13 and 14 are schematic plan views of an arrangement of pixels, according to another embodiment.
Figure 14:
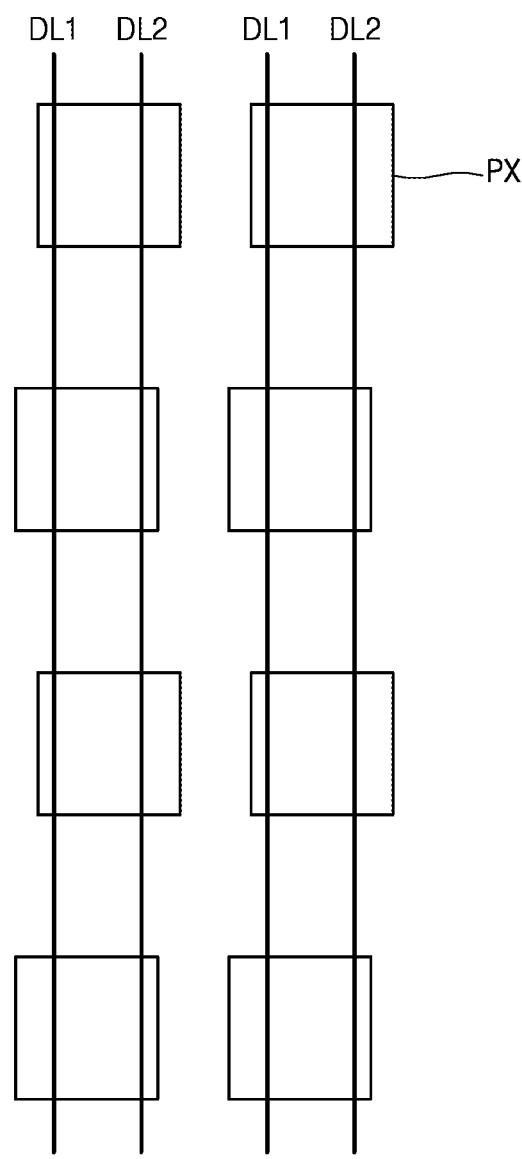

FIGS. 13 and 14 are schematic plan views of an arrangement of pixels, according to another embodiment. For convenience of description, signal lines other than data lines have been omitted in FIG. 14.

The embodiment of FIG. 13 is different from the embodiment of FIG. 11 in that the first and second data lines DL1 and DL2 extend in the first direction in a straight line and a pixel in an odd row and a pixel in an even row are shifted by a certain distance. Hereinafter, differences between the embodiments will be mainly described.

FIG. 13 shows the first to fourth pixels PX1 to PX4 respectively provided in two adjacent rows and two adjacent columns on a substrate. Hereinafter, for convenience, the adjacent rows and columns will be referred to as a first row, a second row, a first column, and a second column. The first row is an odd row and the second row is an even row.

Based on a line X between the first and second rows, the first pixel PX1 in the first column of the first row forms a vertical flip structure with the second pixel PX2 in the first column of the second row and the third pixel PX3 in the second column of the first row forms a vertical flip structure with the fourth pixel PX4 in the second column of the second row. That is, corresponding transistors are oppositely arranged. Transistors of the first and third pixels PX1 and PX3 in the first row are identically arranged, and the transistors of the second and fourth pixels PX2 and PX4 in the second row are identically arranged.

The first and second data lines DL1 and DL2 may be arranged in each of the columns and be substantially parallel to one another. One of the first and second data lines DL1 and DL2, for example, the first data line DL1 may be connected to pixels in an odd row from among pixels arranged in a column, and may overlap a first electrode S1 in a first direction of a first transistor T1 of each of the connected pixels. The second data line DL2 may be connected to pixels in an even row from among the pixels arranged in the column, and may overlap a first electrode S1 in the first direction of a first transistor T1 of each of the connected pixels.

The first and second data lines DL1 and DL2 extend over the first and second pixels PX1 and PX2 in a straight line.

The first data line DL1 in the first pixel PX1 may overlap a semiconductor layer arranged in the first direction on a left side of the capacitor Cst of the first pixel PX1. The second pixel PX2 may be shifted leftward by a distance d. The first data line DL1 may be provided between the capacitor Cst, and a semiconductor layer arranged in the first direction on a left side of the capacitor Cst of the second pixel PX2. For example, the first data line DL1 may overlap the first area S1a of the first electrode S1 of the first transistor T1 of the first pixel PX1. The first data line DL1 may partially overlap a semiconductor layer of the second transistor T2, a semiconductor layer of the fourth transistor T4, and a semiconductor layer of the fifth transistor T5 of the first pixel PX1. The first data line DL1 may partially overlap the second area D1b of the second electrode D1 of the first transistor T1 of the second pixel PX2, but not overlap the first area D1a.

Also, the second data line DL2 in the first pixel PX1 may be provided between the capacitor Cst, and a semiconductor layer arranged in the first direction on a right side of the capacitor Cst of the first pixel PX1. The second pixel PX2 may be shifted rightward by a distance d, and the second data line DL2 may overlap a semiconductor layer arranged in the first direction on a right side of the capacitor Cst of the second pixel PX2. For example, the second data line DL2 may overlap the first area S1a of the first electrode S1 of the first transistor T1 of the second pixel PX2. The second data line DL2 may partially overlap a semiconductor layer of the second transistor T2, a semiconductor layer of the fourth transistor T4, and a semiconductor layer of the fifth transistor T5 of the second pixel PX2. The second data line DL2 may partially overlap the second area D1b of the second electrode D1 of the first transistor T1 of the first pixel PX1, but not overlap the first area D1a.

That is, according to the present embodiment, the first and second data lines DL1 and DL2 may extend in the first direction in a straight line, and a pixel in an odd row and a pixel in an even row may be shifted by a certain distance, and thus, as shown in FIG. 14, the pixels are arranged in zigzags in the column direction.

According to the aforementioned embodiments, the first and second data lines DL1 and DL2 overlap the first electrode of the first transistor T1 which is a source electrode. However, the described technology is not limited thereto. Depending on a type of a transistor included in a pixel, the first and second data lines DL1 and DL2 may overlap the second electrode of the first transistor T1 which is a drain electrode.

According to at least one of the disclosed embodiments, a data line or a pixel may be shifted such that loads of two data lines in a single pixel are asymmetrical, and thus, crosstalk between data lines may be reduced and capacitance may be secured.

While the inventive technology has been described with reference to the figures, it will be understood by those of ordinary skill in the art that various changes in form and details may be made therein without departing from the spirit and scope as defined by the following claims.

What is claimed is:

1. A display device comprising:
    a plurality of pixels arranged in rows and columns over a substrate, each of the pixels comprising a first transistor that comprises a first electrode and a second electrode in a column direction, and a channel that is curved between the first and second electrodes, and a capacitor overlapping the first transistor; and
    a pair of a first data line and a second data line parallel to one another in each column;
    the first data line connected to at least one first pixel in an odd row of the pixels arranged in a corresponding one of the columns, and overlapping a first electrode of the first transistor of the first pixel; and
    the second data line connected to at least one second pixel in an even row of the pixels arranged in the corresponding column, and overlapping a first electrode of the first transistor of the second pixel,
    wherein respective locations of the first electrode and a second electrode of the first transistor of the first pixel in the odd row are opposite to respective locations of the first electrode and, a second electrode of the first transistor of the second pixel in the even row.

2. The display device of claim 1, wherein each of the capacitors is between the first and second data lines.

3. The display device of claim 1, wherein each of the capacitors overlaps the channel of the corresponding first transistor, wherein a lower electrode of the capacitor is connected to a gate electrode of the first transistor, and wherein an upper electrode of the capacitor covers the lower electrode.

4. The display device of claim 1, wherein the first data line does not overlap the second electrode of the first transistor of the second pixel in the even row, and wherein the second data line does not overlap the second electrode of the first transistor of the first pixel in the odd row.

5. The display device of claim 1, wherein the first and second data lines in the odd row and the first and second data lines in the even row are arranged in zigzags in the column direction.

6. The display device of claim 1, wherein the first and second data lines extend in a straight line, and wherein the first pixel in the odd row and the second pixel in the even row are arranged in zigzags in the column direction.

7. The display device of claim 1, wherein the first electrode of each of the first transistors is a source electrode or a drain electrode.

8. The display device of claim 1, wherein light emitted by a pixel connected to the first data line and light emitted by a pixel connected to the second data line have different colors.

9. The display device of claim 1, wherein a pixel connected to the first data line has a different size from a pixel connected to the second data line.

10. The display device of claim 1, wherein the first and second data lines are alternately arranged in a row direction.

11. A display device comprising:
    a plurality of pixels arranged in rows and columns over a substrate, each of the pixels comprising a first transistor that comprises a first electrode and a second electrode in a column direction, and a channel that is curved between the first and second electrodes, and a capacitor overlapping the first transistor; and
    a pair of a first data line and a second data line parallel to one another in each column;
    the first data line connected to a selected one of a first pixel in an odd row and a second pixel in an even row; and
    the second data line connected to the other one of the first and second pixels that is not connected to the first data line,
    wherein the first and second data lines respectively overlap a first electrode of the first transistor of each of the first and second pixels, and
    wherein respective locations of a first electrode and a second electrode of the first transistor of the first pixel in the odd row are opposite to respective locations of a first electrode and a second electrode of the first transistor of the second pixel in the even row.

12. The display device of claim 11, wherein each of the capacitors is between the first and second data lines.

13. The display device of claim 11, wherein each of the capacitors overlaps the channel of the corresponding first transistor, and wherein a lower electrode of the capacitor is a gate electrode of the first transistor, and wherein an upper electrode of the capacitor covers the lower electrode.

14. The display device of claim 11, wherein the second data line is between the capacitor, and the second electrode of the first transistor of the selected pixel connected to the first data line, and wherein the first data line is between the capacitor, and the second electrode of the first transistor of the other pixel connected to the second data line.

15. The display device of claim 11, wherein the first and second data lines in the odd row and the first and second data lines in the even row are arranged in zigzags in the column direction.

16. The display device of claim 11, wherein the first and second data lines extend in a straight line, and wherein the first pixel in the odd row and the second pixel in the even row are arranged in zigzags in the column direction.

17. The display device of claim 11, wherein the first electrode of each of the first transistors is a source electrode or a drain electrode.

18. The display device of claim 11, wherein light emitted by a pixel connected to the first data line and light emitted by a pixel connected to the second data line have different colors.

19. The display device of claim 11, wherein a pixel connected to the first data line has a different size from a pixel connected to the second data line.

20. The display device of claim 11, wherein the first and second data lines are alternately arranged in a row direction.

* * * * *